(12) United States Patent
Ma

(10) Patent No.: US 11,181,256 B2
(45) Date of Patent: Nov. 23, 2021

(54) STAND FOR PORTABLE ACCESSORY

(71) Applicant: Zhun-An Ma, Ningbo (CN)

(72) Inventor: Zhun-An Ma, Ningbo (CN)

( * ) Notice: Subject to any disclaimer, the term of this patent is extended or adjusted under 35 U.S.C. 154(b) by 225 days.

(21) Appl. No.: 16/279,470

(22) Filed: Feb. 19, 2019

(65) Prior Publication Data
US 2019/0257504 A1 Aug. 22, 2019

Related U.S. Application Data

(60) Provisional application No. 62/632,738, filed on Feb. 20, 2018.

(51) Int. Cl.
| | |
|---|---|
| *F21V 21/14* | (2006.01) |
| *F16B 2/12* | (2006.01) |
| *F21L 4/08* | (2006.01) |
| *A45B 23/00* | (2006.01) |
| *A45B 3/02* | (2006.01) |
| *F16M 11/04* | (2006.01) |

(Continued)

(52) U.S. Cl.
CPC ............ *F21V 21/145* (2013.01); *A45B 23/00* (2013.01); *F16B 2/12* (2013.01); *F16M 11/041* (2013.01); *F21L 4/08* (2013.01); *F21S 6/002* (2013.01); *F21V 21/22* (2013.01); *F21V 23/06* (2013.01); *F21V 33/006* (2013.01); *F21V 33/0056* (2013.01); *H05K 5/0234* (2013.01); *A45B 3/02* (2013.01); *A45B 2023/0012* (2013.01); *A45B 2200/1018* (2013.01); *F21Y 2115/10* (2016.08); *H04R 1/028* (2013.01)

(58) Field of Classification Search
CPC ........ F21V 21/145; F21V 21/22; F21V 23/06; F21V 33/056; F21V 33/006; A45B 23/00; F16B 2/12; F16M 11/041; F21L 4/08; F21S 6/002; H05K 5/0234
See application file for complete search history.

(56) References Cited

U.S. PATENT DOCUMENTS

| | | |
|---|---|---|
| 2,047,045 A | 7/1936 | Veenboer |
| 2,087,537 A | 7/1937 | Milton |

(Continued)

FOREIGN PATENT DOCUMENTS

| | | |
|---|---|---|
| CN | 201025354 | 2/2008 |
| CN | 202262527 | 6/2012 |

(Continued)

OTHER PUBLICATIONS

Extended European Search Report issued in European Patent Application No. 13189717.5, dated Feb. 27, 2014, in 5 pages.

(Continued)

*Primary Examiner* — Anabel Ton
(74) *Attorney, Agent, or Firm* — Knobbe, Martens, Olson & Bear, LLP

(57) ABSTRACT

A free-standing accessory stand that includes a ground support portion and an enclosure is provided. The enclosure is disposed about a central axis of the accessory stand. The upper surface faces away from the ground support. The accessory stand includes a retractable accessory support that has an outer surface projecting away from the enclosure in a first configuration. A mounting space is provided along the outer surface of the retractable accessory support above the upper surface of the enclosure. The outer surface is retracted in a second configuration.

25 Claims, 18 Drawing Sheets

(51) Int. Cl.
  *F21V 21/22* (2006.01)
  *F21V 23/06* (2006.01)
  *H05K 5/02* (2006.01)
  *F21S 6/00* (2006.01)
  *F21V 33/00* (2006.01)
  *H04R 1/02* (2006.01)
  *F21Y 115/10* (2016.01)

(56) References Cited

U.S. PATENT DOCUMENTS

| | | |
|---|---|---|
| 2,176,667 A | 10/1939 | Crowley |
| 2,547,896 A | 4/1951 | Cafardi |
| 2,960,094 A | 11/1960 | Cohen |
| 3,449,002 A | 6/1969 | Bernard |
| 3,683,172 A | 8/1972 | Noyes |
| 3,752,407 A | 8/1973 | Baugh |
| 3,801,809 A | 4/1974 | Slade |
| 4,020,858 A | 5/1977 | Wilson |
| 4,174,532 A | 11/1979 | Kelley |
| 4,225,909 A | 9/1980 | Whiteway |
| 4,425,602 A | 1/1984 | Lansing |
| D283,647 S | 4/1986 | Schumann |
| 4,601,120 A | 7/1986 | Levin |
| 4,628,791 A | 12/1986 | Phipps |
| 4,684,230 A | 8/1987 | Smith |
| 4,787,019 A | 11/1988 | van den Broeke |
| 4,788,995 A | 12/1988 | Rushing |
| 4,800,909 A | 1/1989 | Seidel et al. |
| 4,867,187 A | 9/1989 | Divine |
| 4,872,468 A | 10/1989 | Cole |
| 4,881,154 A | 11/1989 | Tseng |
| 4,915,670 A | 4/1990 | Nesbit |
| 4,953,839 A | 9/1990 | Chern |
| 4,962,779 A | 10/1990 | Meng |
| 5,007,811 A | 4/1991 | Hopkins |
| 5,029,239 A | 7/1991 | Nesbit |
| 5,053,931 A | 10/1991 | Rushing |
| 5,055,984 A | 10/1991 | Hung et al. |
| 5,116,258 A | 5/1992 | Vennik |
| 5,126,922 A | 6/1992 | Jacinto |
| 5,143,108 A | 9/1992 | Kenney |
| 5,150,963 A | 9/1992 | Hill |
| 5,152,495 A | 10/1992 | Jacinto |
| 5,163,752 A | 11/1992 | Copeland et al. |
| 5,172,711 A | 12/1992 | Mueller |
| 5,207,238 A | 5/1993 | Rivera et al. |
| 5,213,122 A | 5/1993 | Grady |
| 5,216,948 A | 6/1993 | Sheppard et al. |
| D341,831 S | 11/1993 | Mozdzanowski |
| 5,273,062 A | 12/1993 | Mozdzanowski |
| 5,275,364 A | 1/1994 | Burger |
| 5,280,799 A | 1/1994 | Alajajian |
| 5,291,908 A | 3/1994 | Grady, II |
| 5,321,579 A | 6/1994 | Brown et al. |
| 5,323,798 A | 6/1994 | Yang |
| 5,331,524 A | 7/1994 | Tseng |
| 5,349,975 A | 9/1994 | Valdner |
| 5,351,173 A | 9/1994 | Byrne |
| 5,422,801 A | 6/1995 | Sangalli, Jr. |
| 5,426,577 A | 6/1995 | Gordin et al. |
| 5,449,012 A | 9/1995 | Friedman |
| 5,463,535 A | 10/1995 | Vest |
| 5,502,624 A | 3/1996 | Tu |
| 5,584,564 A | 12/1996 | Phyle |
| 5,611,614 A | 3/1997 | Morgan |
| 5,683,064 A | 11/1997 | Copeland et al. |
| 5,683,070 A | 11/1997 | Seed |
| 5,707,135 A | 1/1998 | Miller |
| 5,816,685 A | 10/1998 | Hou |
| 5,831,413 A | 11/1998 | Gould |
| 5,860,728 A | 1/1999 | Maglica |
| 5,902,080 A | 5/1999 | Kopras |
| D413,992 S | 9/1999 | Muhammad |
| 5,954,417 A | 9/1999 | Mai |
| 5,960,805 A | 10/1999 | Murphy |
| 5,964,233 A | 10/1999 | Clark et al. |
| 5,996,511 A | 12/1999 | Swoger |
| 6,013,985 A | 1/2000 | Green et al. |
| 6,017,188 A | 1/2000 | Benton |
| 6,024,464 A | 2/2000 | De Vera |
| 6,027,309 A | 2/2000 | Rawls |
| 6,039,062 A | 3/2000 | Karakaedos |
| 6,058,951 A | 5/2000 | Wilson |
| 6,089,727 A | 7/2000 | Wu |
| 6,126,291 A | 10/2000 | Chung-Kuang et al. |
| 6,126,293 A | 10/2000 | Wu |
| 6,134,103 A | 10/2000 | Ghanma |
| 6,135,605 A | 10/2000 | Hsu |
| 6,138,970 A | 10/2000 | Sohrt |
| 6,158,451 A | 12/2000 | Wu |
| 6,158,701 A | 12/2000 | Deshler |
| 6,196,242 B1 | 3/2001 | Xu |
| 6,270,230 B1 | 8/2001 | Mai |
| 6,283,610 B1 | 9/2001 | Alajajian |
| 6,298,866 B1 | 10/2001 | Molnar, IV |
| 6,340,233 B1 | 1/2002 | Shieh |
| 6,341,873 B1 | 1/2002 | Tai |
| 6,347,776 B1 | 2/2002 | Chuang |
| 6,382,809 B1 | 5/2002 | Ou-Yang |
| 6,397,869 B1 | 6/2002 | Jennings |
| 6,412,889 B1 | 7/2002 | Hummell et al. |
| 6,439,249 B1 | 8/2002 | Pan et al. |
| 6,439,732 B1 | 8/2002 | Weisbach et al. |
| 6,519,144 B1 | 2/2003 | Henrie et al. |
| D475,801 S | 6/2003 | Stewart |
| 6,598,990 B2 | 7/2003 | Li |
| 6,612,713 B1 | 9/2003 | Kuelbs |
| 6,636,918 B1 | 10/2003 | Aguilar et al. |
| 6,659,616 B1 | 12/2003 | Bilotti |
| 6,666,224 B2 | 12/2003 | Lee |
| 6,682,204 B2 | 1/2004 | Mullally et al. |
| 6,692,135 B2 | 2/2004 | Li |
| 6,732,752 B2 | 5/2004 | Cohen et al. |
| 6,749,166 B2 | 6/2004 | Valentine et al. |
| 6,765,789 B2 | 7/2004 | Yang |
| 6,796,318 B2 | 9/2004 | Cohen et al. |
| 6,830,058 B2 | 12/2004 | Li |
| 6,837,255 B2 | 1/2005 | Bunch |
| 6,840,657 B2 | 1/2005 | Tung |
| 6,851,823 B2 | 2/2005 | Bilotti |
| 6,923,193 B2 | 8/2005 | Chen |
| 6,923,194 B2 | 8/2005 | Li |
| 6,959,996 B2 | 11/2005 | Ip |
| 6,961,237 B2 | 11/2005 | Dickie |
| 6,966,667 B2 | 11/2005 | Li |
| 7,013,903 B2 | 3/2006 | Li |
| 7,017,598 B2 | 3/2006 | Nipke |
| 7,021,787 B1 | 4/2006 | Kuelbs |
| 7,034,902 B2 | 4/2006 | Tajima |
| 7,063,433 B2 | 6/2006 | Pape et al. |
| 7,108,388 B2 | 9/2006 | Li |
| 7,111,954 B1 | 9/2006 | Lai |
| 7,125,133 B2 | 10/2006 | Bilotti et al. |
| 7,128,076 B2 | 10/2006 | Freedman |
| 7,134,762 B2 | 11/2006 | Ma |
| 7,143,601 B1 | 12/2006 | Jimenez |
| 7,188,633 B2 | 3/2007 | Zerillo |
| D542,454 S | 5/2007 | Chan |
| 7,300,189 B2 | 11/2007 | England et al. |
| D558,908 S | 1/2008 | Waedeled |
| 7,331,684 B2 | 2/2008 | Tung |
| D564,687 S | 3/2008 | Bucher |
| 7,401,936 B1 | 7/2008 | Fan |
| 7,422,343 B2 | 9/2008 | Li |
| 7,431,469 B2 | 10/2008 | Li |
| D580,421 S | 11/2008 | Sculler et al. |
| 7,481,547 B2 | 1/2009 | Li |
| 7,497,225 B1 | 3/2009 | Klein, Jr. et al. |
| 7,497,583 B2 | 3/2009 | Ma |
| 7,537,015 B1 | 5/2009 | Bender et al. |
| 7,557,297 B2 | 7/2009 | Axland et al. |
| 7,559,520 B2 | 7/2009 | Quijano et al. |
| 7,562,667 B2 | 7/2009 | Li |
| 7,593,220 B2 | 9/2009 | Proctor et al. |

(56) References Cited

U.S. PATENT DOCUMENTS

| | | |
|---|---|---|
| 7,604,015 B2 | 10/2009 | Fraser |
| 7,614,600 B1 | 11/2009 | Smith et al. |
| 7,625,241 B2 | 12/2009 | Axland et al. |
| 7,625,242 B2 | 12/2009 | Axland et al. |
| 7,626,119 B2 | 12/2009 | Axland et al. |
| 7,631,653 B2 | 12/2009 | Young |
| 7,645,169 B2 | 1/2010 | Axland et al. |
| 7,648,339 B1 | 1/2010 | Ediger et al. |
| 7,650,230 B1 | 1/2010 | Laverick et al. |
| 7,665,477 B1 | 2/2010 | Hathaway |
| 7,695,153 B2 | 4/2010 | Tsai |
| 7,753,546 B2 | 7/2010 | Kuelbs |
| 7,755,975 B2 | 7/2010 | Pettersen et al. |
| 7,778,624 B2 | 8/2010 | Li |
| 7,828,002 B2 | 11/2010 | Boldsen |
| 7,836,905 B2 | 11/2010 | Tarter et al. |
| 7,856,996 B2 | 12/2010 | Ma |
| 7,975,711 B2 | 7/2011 | Li |
| 8,015,988 B2 | 9/2011 | Li |
| 8,061,374 B2 | 11/2011 | Li |
| 8,069,868 B2 | 12/2011 | Kuelbs |
| 8,082,937 B2 | 12/2011 | Tarter et al. |
| 8,104,491 B2 | 1/2012 | Li |
| 8,116,497 B2 | 2/2012 | Li |
| 8,267,104 B2 | 9/2012 | Li |
| 8,331,598 B2 | 12/2012 | Li |
| 8,345,889 B2 | 1/2013 | Li |
| 8,360,079 B2 | 1/2013 | Li |
| 8,393,341 B2 | 3/2013 | Li |
| D680,673 S | 4/2013 | Levine |
| 8,444,104 B2 | 5/2013 | Li |
| 8,453,659 B2 | 6/2013 | Li |
| 8,459,282 B2 | 6/2013 | Gorey et al. |
| 9,030,829 B2 | 5/2015 | Ma |
| 9,125,462 B2 | 9/2015 | Akin et al. |
| 9,468,273 B1 | 10/2016 | Hasselbach et al. |
| 9,826,653 B2 | 11/2017 | Ma |
| 10,398,049 B2 | 8/2019 | Ma |
| D869,718 S | 12/2019 | Ma |
| D897,019 S | 9/2020 | Ma |
| 2001/0001083 A1 | 5/2001 | Helot |
| 2002/0074027 A1 | 6/2002 | Maidment |
| 2003/0002688 A1 | 1/2003 | Kanevsky et al. |
| 2003/0067765 A1 | 4/2003 | Ying |
| 2003/0102021 A1 | 6/2003 | Cohen |
| 2003/0168091 A1 | 9/2003 | Cohen |
| 2003/0192579 A1 | 10/2003 | Llamas Garijo |
| 2004/0007259 A1 | 1/2004 | Manolis |
| 2004/0031513 A1 | 2/2004 | Bunch |
| 2004/0055627 A1 | 3/2004 | Moga |
| 2004/0095749 A1 | 5/2004 | Bilotti |
| 2004/0100791 A1 | 5/2004 | Bilotti |
| 2004/0149325 A1 | 8/2004 | Juelbs |
| 2004/0221883 A1 | 11/2004 | Nipke |
| 2004/0228118 A1 | 11/2004 | Peterson |
| 2004/0240167 A1 | 12/2004 | Ledbetter |
| 2004/0256852 A1 | 12/2004 | Benedict |
| 2005/0016571 A1 | 1/2005 | Wu |
| 2005/0069153 A1 | 3/2005 | Hall |
| 2005/0072451 A1 | 4/2005 | Vivian |
| 2005/0105898 A1 | 5/2005 | Bachinski |
| 2005/0128740 A1 | 6/2005 | Currie et al. |
| 2005/0133077 A1 | 6/2005 | Zerillo |
| 2005/0161067 A1 | 7/2005 | Hollins |
| 2005/0254228 A1 | 11/2005 | Li |
| 2006/0005867 A1 | 1/2006 | Chang |
| 2006/0005869 A1 | 1/2006 | Kuelbs |
| 2006/0044152 A1 | 3/2006 | Wang |
| 2006/0124122 A1 | 6/2006 | Young |
| 2006/0124157 A1 | 6/2006 | Bayour |
| 2006/0127034 A1 | 6/2006 | Brooking |
| 2006/0196532 A1 | 9/2006 | Tung |
| 2006/0266398 A1 | 11/2006 | Wu |
| 2007/0047185 A1 | 3/2007 | Lee et al. |
| 2007/0056617 A1 | 3/2007 | Li |
| 2007/0058360 A1 | 3/2007 | Li |
| 2007/0070588 A1 | 3/2007 | Lin |
| 2007/0074751 A1 | 4/2007 | Fraser |
| 2007/0127231 A1 | 6/2007 | Li |
| 2007/0133191 A1 | 6/2007 | Ma |
| 2007/0133219 A1 | 6/2007 | Chaloult et al. |
| 2007/0151588 A1 | 7/2007 | Jiu et al. |
| 2007/0242450 A1 | 10/2007 | Blatecky |
| 2007/0254695 A1 | 11/2007 | Langberg et al. |
| 2007/0279856 A1 | 12/2007 | Bragg |
| 2008/0053496 A1 | 3/2008 | Li |
| 2008/0056898 A1 | 3/2008 | Li |
| 2008/0062675 A1 | 3/2008 | Tung |
| 2008/0072945 A1 | 3/2008 | Grand Pre et al. |
| 2008/0076379 A1 | 3/2008 | Li |
| 2008/0092440 A1 | 4/2008 | Johnson |
| 2008/0092936 A1 | 4/2008 | Carabillo |
| 2008/0095382 A1 | 4/2008 | Mott |
| 2008/0118089 A1 | 5/2008 | Li |
| 2008/0163908 A1 | 7/2008 | O'Kere |
| 2008/0238270 A1 | 10/2008 | Wayman et al. |
| 2008/0262657 A1 | 10/2008 | Howell et al. |
| 2008/0271768 A1 | 11/2008 | Li |
| 2008/0292120 A1 | 11/2008 | Wilson |
| 2009/0014041 A1 | 1/2009 | Li |
| 2009/0056775 A1 | 3/2009 | Kuelbs |
| 2009/0058354 A1 | 3/2009 | Harrison |
| 2009/0071516 A1 | 3/2009 | Li |
| 2009/0090404 A1 | 4/2009 | Kuelbs |
| 2009/0120475 A1 | 5/2009 | Li |
| 2009/0120476 A1 | 5/2009 | Li |
| 2009/0193578 A1 | 8/2009 | Jang et al. |
| 2009/0196020 A1 | 8/2009 | Tsai |
| 2009/0250982 A1 | 10/2009 | Cohen |
| 2009/0284216 A1 | 11/2009 | Bessa et al. |
| 2009/0314319 A1 | 12/2009 | Young |
| 2009/0320827 A1 | 12/2009 | Thompson et al. |
| 2010/0024855 A1 | 2/2010 | Li |
| 2010/0024856 A1 | 2/2010 | Li |
| 2010/0097441 A1 | 4/2010 | Trachtenberg |
| 2010/0154786 A1 | 6/2010 | Li |
| 2010/0192999 A1 | 8/2010 | Li |
| 2010/0245032 A1 | 9/2010 | Li |
| 2010/0307547 A1 | 12/2010 | Li |
| 2010/0319737 A1 | 12/2010 | Li |
| 2010/0320819 A1 | 12/2010 | Cohen |
| 2010/0326849 A1 | 12/2010 | Trimarche |
| 2011/0005560 A1 | 1/2011 | Nair |
| 2011/0023931 A1 | 2/2011 | Chen |
| 2011/0066302 A1 | 3/2011 | McEwan |
| 2011/0157801 A1 | 6/2011 | Satterfield |
| 2011/0227695 A1 | 9/2011 | Li |
| 2011/0265694 A1 | 11/2011 | Hampton et al. |
| 2012/0017958 A1 | 1/2012 | Brockel et al. |
| 2012/0021269 A1 | 1/2012 | Tartar et al. |
| 2012/0073616 A1 | 3/2012 | Kuelbs |
| 2012/0140455 A1 | 6/2012 | Chang |
| 2018/0092203 A1 | 3/2018 | Ma |
| 2018/0249054 A1* | 8/2018 | Chien .............. H04N 5/2257 |

FOREIGN PATENT DOCUMENTS

| | | |
|---|---|---|
| DE | 9319387 U1 | 2/1994 |
| EP | 2 721 944 | 4/2014 |
| FR | 2628950 | 9/1989 |
| GB | 2396205 A | 6/2004 |
| JP | H08-158702 | 6/1996 |
| JP | 2002-204710 | 7/2002 |
| NL | 9301852 | 5/1995 |
| WO | WO 1990/000840 | 1/1990 |
| WO | WO 1990/06069 A | 6/1990 |
| WO | WO 1993/005688 A1 | 4/1993 |
| WO | WO 1998/049915 A1 | 11/1998 |
| WO | WO 2000/013541 A1 | 3/2000 |
| WO | WO 2002/069751 A1 | 9/2002 |
| WO | WO 2003/092428 A1 | 11/2003 |
| WO | WO 2004/088076 A1 | 10/2004 |

(56) References Cited

FOREIGN PATENT DOCUMENTS

OTHER PUBLICATIONS

Treasure Garden 2013 Product Catalog, copyright 2012, Treasure Garden, Inc., "Serenata Umbrella Lights", pp. 86-87.

* cited by examiner

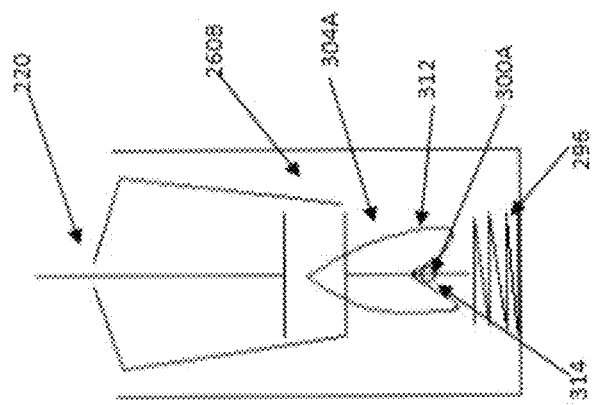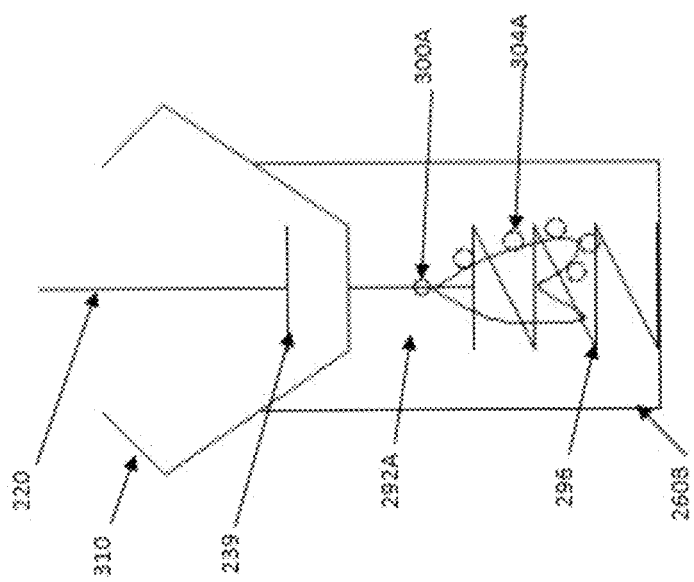
FIG. 7B

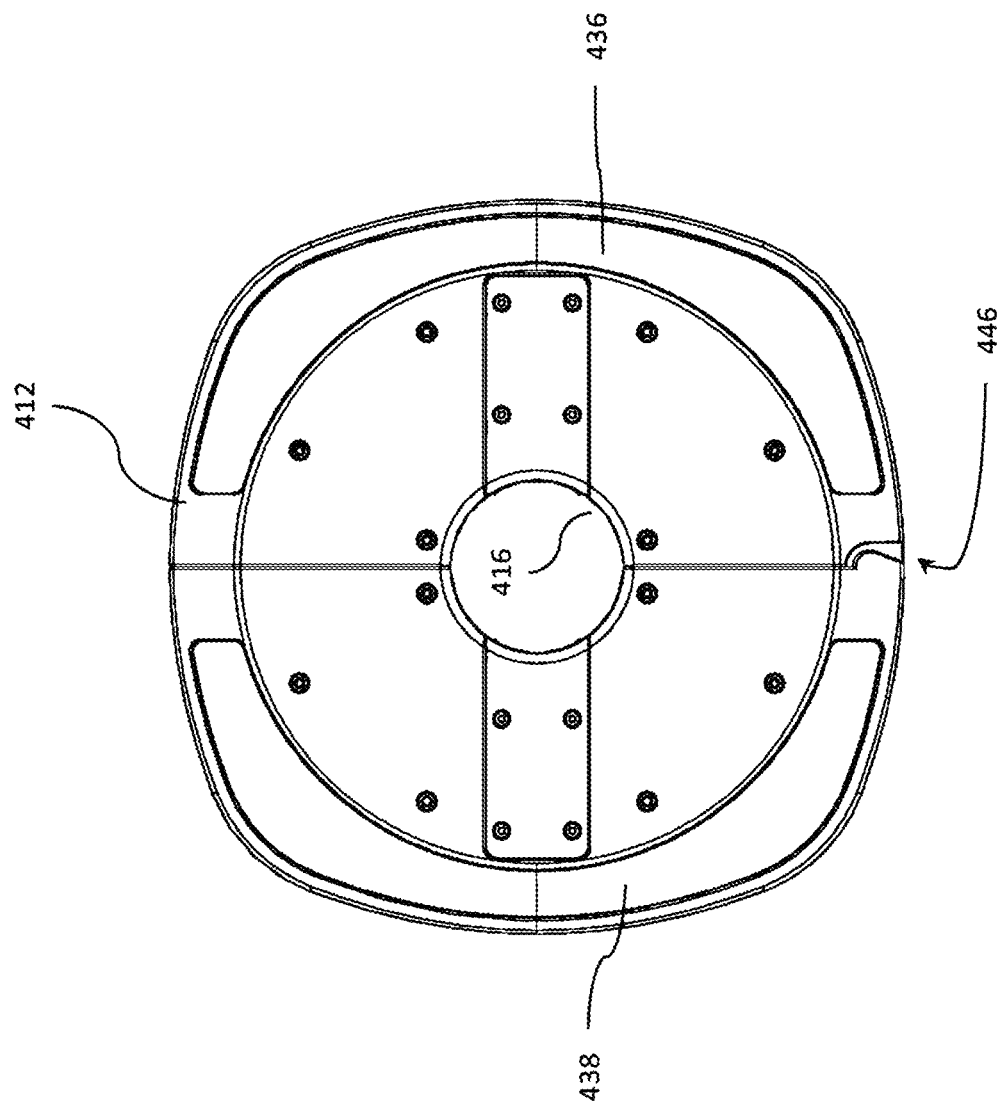

STAND FOR PORTABLE ACCESSORY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. § 1.57.

BACKGROUND OF THE INVENTION

Field of the Invention

This application discloses a light stand and a portable accessory including a portable light that can be coupled therewith.

Description of the Related Art

A portable light configured to be supported on an umbrella pole has been commercially available for a number of years. The portable light has a clam shell housing that can be opened to allow the umbrella pole to be positioned within an outer periphery of the housing. The housing can have an inner periphery that is larger than the outer diameter of the umbrella pole to which the portable light is to be coupled. Closing the clam shell housing can enclose the pole within the inner and the outer peripheries of the portable light. The clam shell can be held closed with a releasable clasp that can be opened again such that the portable light can be taken off the umbrella pole and then later put back on the umbrella pole.

The portable light can also be mounted on a deployable support as has been disclosed. A deployable support can be extended from an umbrella hub such that the portable light can be mounted to a central area of a shade structure of a cantilever umbrella. The deployable support provides central area mounting of the portable light even though the shade structure is not supported from immediately beneath the shade structure by an umbrella pole.

Portable accessories that are mountable to an umbrella pole can have lights and/or audiovisual components, such as speakers and connections for source inputs to provide audio content to the speakers.

SUMMARY OF THE INVENTION

Improved products for storing, charging and using portable accessories, such as portable lights and/or audiovisual components, when separated from umbrellas would be beneficial. It would be beneficial, for example, to provide a device for coupling with a portable accessory to enhance the use and enjoyment thereof.

A stand to couple with a portable light or other portable accessory to provide for storing and charging of the portable light or accessory would enhance the usefulness and enjoyment of the portable light or accessory.

In one form a portable light stand can have a speaker that can provide an audio output of audio content stored on the portable light. In one form the portable light stand can have audio source that can be transmitted to speakers in the portable light.

In one embodiment a free-standing accessory stand is provided. The accessory stand includes a ground support portion, an enclosure, an upper surface, an accessory support, a cap and a mounting surface. The ground support portion has a plurality of spaced apart feet. The enclosure extends upward relative to the ground support. The enclosure is disposed about a central axis thereof. The enclosure surrounds a component space configured for one or more electrical components to be disposed therein. The upper surface extends transversely away from the central axis of the enclosure. The upper surface faces away from the ground support. The accessory support has an outer surface that projects away from the upper surface along the central axis of the enclosure. The cap is disposed at a free end of the accessory support. The cap has a lower surface that extends transversely away from the central axis of the enclosure. The mounting space is provided between the upper surface of the enclosure, the lower surface of the cap, and the outer surface of the accessory support.

In another embodiment a portable accessory is provided that includes an accessory enclosure, an outer periphery, and an electrical component disposed within the accessory enclosure. The accessory enclosure has a first shell and a second shell. The outer periphery and an inner periphery each are defined in part by the first shell and the second shell. The portable accessory also includes an electrical contact disposed on or within the inner periphery of the accessory enclosure. The portable accessory is configured to provide or receive an electrical impulse through the electrical contact.

In another embodiment a free-standing accessory stand is provided that includes a ground support portion and an enclosure. The enclosure extends upward relative to the ground support. The enclosure is disposed about a central axis of the accessory stand. The accessory stand includes a retractable accessory support that has an outer surface projecting along the central axis in a first configuration. The outer surface is retracted in a second configuration. A mounting space is provided along the outer surface of the retractable accessory support above the enclosure.

The ground support portion of the free-standing accessory stand optionally has a plurality of spaced apart feet.

The accessory stand optionally has an upper surface that extends transversely away from the central axis. The upper surface, if provided, faces away from the ground support. The outer surface of the retractable accessory support projects away from the upper surface along the central axis in the first configuration. The outer surface is retracted below the upper surface in the second configuration. The mounting space is provided along the outer surface of the retractable accessory support above the upper surface of the enclosure.

In some embodiments, there is provided a speaker lamp that can provide a lighting function as well as a speaker function. In addition, the structure can be used as one unit (e.g., with the free standing stand and the portable accessory) and also be used as two separate units (e.g., the stand as a speaker and the accessory separately mounted to an umbrella pole). The ability to separate part of the speaker lamp accessory into two components provides these advantageous functionalities. When used together the enclosure can provide a first light, the cap can provide a second light, and the portable accessory can provide at least one additional light. Also, the enclosure of the stand can provide a first speaker and the portable accessory can provide at least a second speaker.

BRIEF DESCRIPTION OF THE DRAWINGS

These and other features, aspects and advantages are described below with reference to the drawings, which are intended to illustrate but not to limit the inventions. In the drawings, like reference characters denote corresponding features consistently throughout similar embodiments. The following is a brief description of each of the drawings.

FIG. 7B shows another embodiment of a retraction mechanism in an extended configuration and in a retracted configuration;

FIG. 12 is a bottom view of the portable accessory of FIGS. 1 and 8;

DETAILED DESCRIPTION OF THE PREFERRED EMBODIMENT

While the present description sets forth specific details of various embodiments, it will be appreciated that the description is illustrative only and should not be construed in any way as limiting. Furthermore, various applications of such embodiments and modifications thereto, which may occur to those who are skilled in the art, are also encompassed by the general concepts described herein. Each and every feature described herein, and each and every combination of two or more of such features, is included within the scope of the present invention provided that the features included in such a combination are not mutually inconsistent.

This application discloses and claims various support apparatuses that can be used to store, and in some cases, provide power to portable accessories, such as a portable lights, or portable audio components or the like. The portable accessory can be coupled with support shafts such as umbrella poles whether supporting the umbrella or being supported thereby. This application also discloses accessories that can be coupled with support apparatuses such as support stands and umbrella poles or supports.

Figure 2:
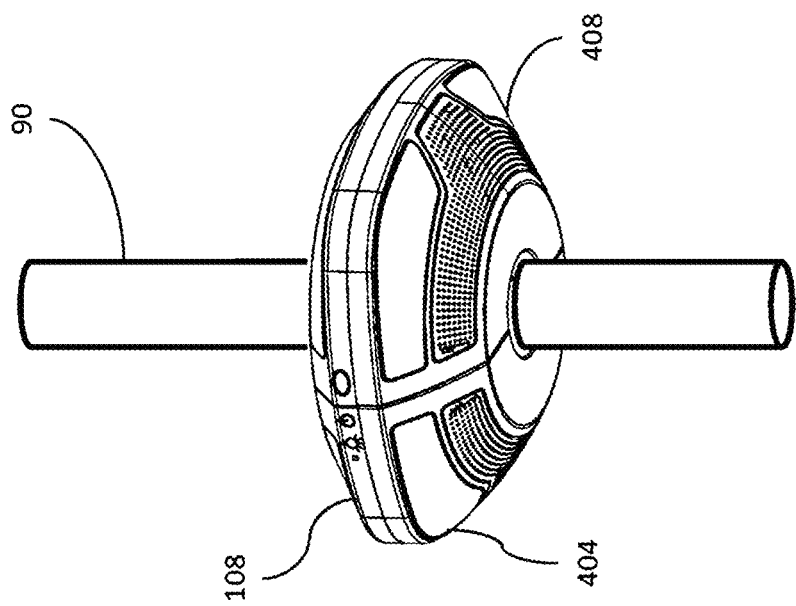
FIG. 2 is a perspective view of the portable accessory of the accessory support stand assembly separated from the accessory support and coupled with a support pole.
Figure 1:
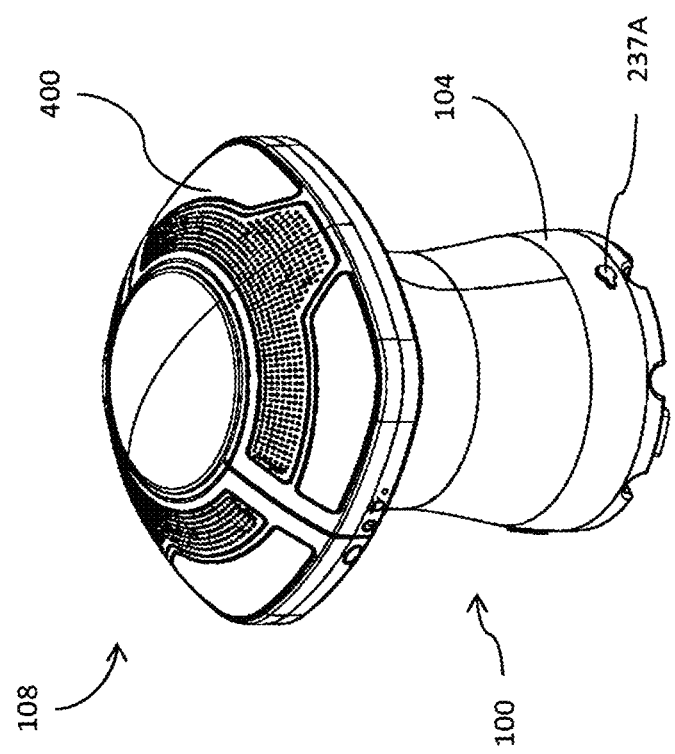
FIG. 1 is a perspective view of one embodiment of an accessory support stand assembly including an accessory stand and a portable accessory.

FIG. 1 shows an assembly 100 that includes a free standing accessory stand 104 and a portable light accessory 108. The free standing accessory stand 104 can be placed on a table or shelf to be close enough to provide light, speaker output or other useful function to users. The portable accessory 108 can be selectively placed on the free standing accessory stand 104 as shown in FIG. 1 or mounted to a pole portion 90 as shown in FIG. 2. The pole portion 90 can be part of an umbrella. The portable accessory 108 can include a first shell 404 and a second shell 408. The second shell 408 can be separated from the first shell 404 to enable the pole portion 90 to be disposed within an inner periphery of the enclosure 400.

Figure 3:
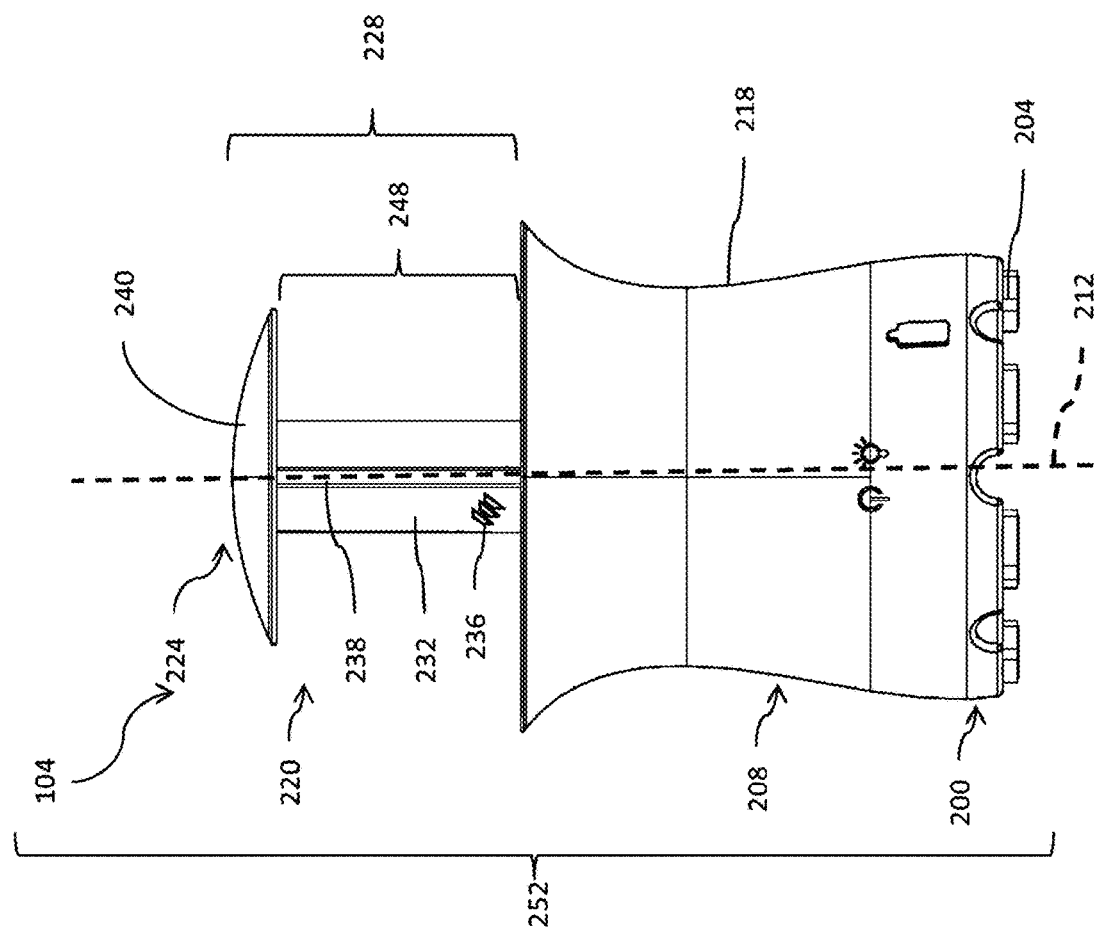
FIG. 3 is a side view of the accessory stand of FIG. 1 in a first configuration.

FIG. 3 shows the free standing accessory stand 104 in a first configuration 252. The first configuration 252 is one in which the portable accessory 108 can be coupled with the free standing accessory stand 104 to form the assembly 100. The free standing accessory stand 104 is elongated in the first configuration 252 along a central axis 212. The free standing accessory stand 104 includes a ground support portion 200 configured to rest on a support surface, such as a table or shelf. The ground support portion 200 can include a plurality of feet 204. The feet 204 can include three, four or another number of feet 204. The feet 204 have a height sufficient to provide a clearance between a lower wall 210 and the ground surface, upon which the free standing accessory stand 104 is placed. The clearance allows sound and/or heat to be conveyed through the lower wall 210 and out from under the free standing accessory stand 104 in spaces between the feet 204.

FIG. 3 shows that an enclosure 208 is provided that can extend upward from the ground support portion 200, e.g., away from the feet 204. The enclosure 208 can include a curved side wall 218 that extends between the lower wall 210 and an upper surface 216 of the enclosure 208. The enclosure 208 can surround or enclose one or more spaces in which one or more components can be housed, as discussed further below in connection with FIG. 7. The enclosure 208 can surround a plurality of separate compartments for different functional components of the free standing accessory stand 104.

Figure 4:
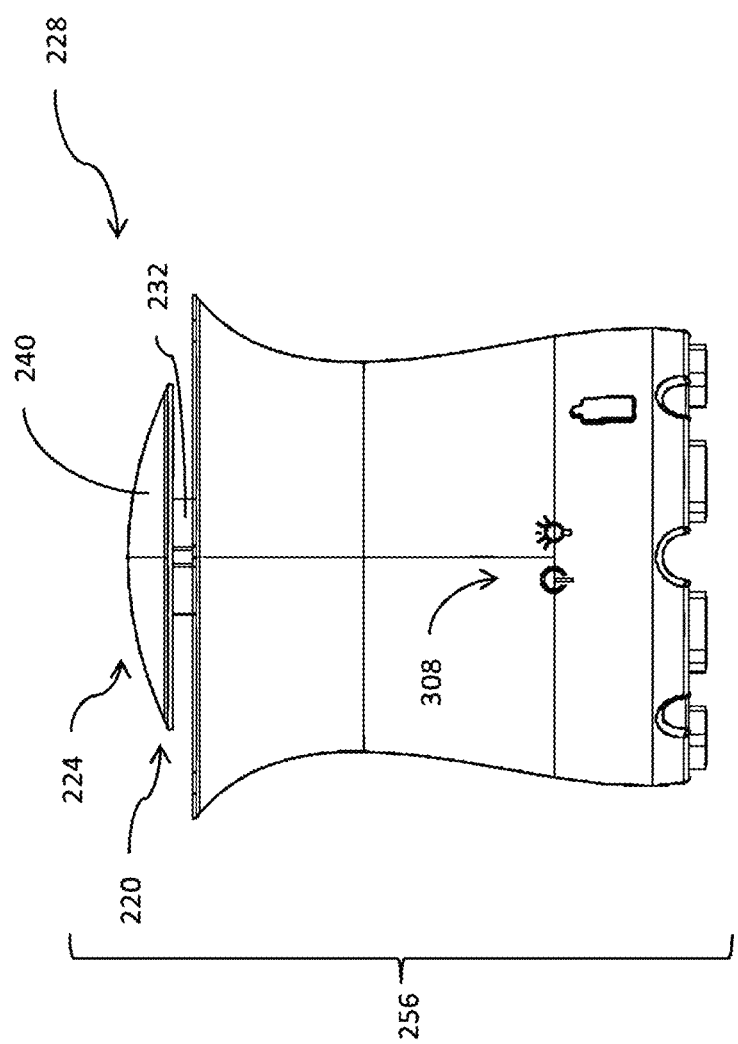
FIG. 4 is a side view similar to that of FIG. 3 with the accessory stand in a second configuration.

The free standing accessory stand 104 also includes an accessory support 220 that is disposed above the upper surface 216. The accessory support 220 can be partially disposed in the enclosure 208 at a first end in the first configuration 252. The accessory support 220 can extend from the partially exposed portion through the upper surface 216 to a free end 224. The accessory support 220 can include an outer surface 232 that can include a cylindrical portion. The outer surface 232 can extend between the upper surface 216 and the free end 224. The outer surface 232 can be a surface against which the portable accessory 108 is mated. The accessory 108 can be releasably coupled to the outer surface 232. In some embodiments the free end 224 of the accessory support 220 includes a retractable end 228. The retractable end 228 allows the accessory support 220 to be retracted into the enclosure 208 when the accessory support 220 is not needed. The accessory support 220 may not be needed when an accessory coupled therewith is removed from the free standing accessory stand 104, e.g., when coupled with an umbrella pole as illustrated in FIG. 2. This can facilitate placing the free standing accessory stand 104 in a second configuration 256 as shown in FIG. 4.

In the second configuration 256 the accessory support 220 is moved at least partially into the enclosure 208. The retractable end 228 of the free standing accessory stand 104 is retracted into a lower portion of the free standing accessory stand 104. In the illustrated embodiment, the outer surface 232 that is exposed in the first configuration 252 is located almost entirely within the interior space of the enclosure 208. FIG. 4 shows that the outer surface 232 of the accessory support 220 is almost entirely hidden from view when the free standing accessory stand 104 is in the second configuration 256. In this embodiment, the outer surface 232 is not needed to support the portable accessory 108 and is within the enclosure 208 out of the way.

In some embodiments the accessory support 220 can include a guiding rail 238 to facilitate movement of the retractable end 228 relative to a lower portion of the free standing accessory stand 104. The guiding rail 238 can include an elongate structure having one or more discontinuities relative to the outer surface 232. The guiding rail 238 can include a convex ridge that extends in a vertical direction between the upper surface 216 and a portion of the outer surface 232 disposed above the upper surface 216. The accessory support 220 can be rotationally aligned with an opening in the upper surface 216 such that the guiding rail 238 is disposed in a concave feature of the same shape but slightly larger size. The concave feature retains the guiding rail 238 and prevents the guiding rail 238 and the accessory support 220 from rotating out of position relative to the enclosure 208 or reduces such rotation. As a result, the rotational position of the outer surface 232 and of the accessory support 220 is maintained substantially constant as the retractable end 228 is being retracted into or is being extended from the lower portion of the free standing accessory stand 104. In another embodiment, the guiding rail 238 can be in the form of a concave channel formed in the outer surface 232. The channel can provide an elongate, linear structure that can receive a projection disposed on the upper surface 216 of the free standing accessory stand 104 or within the enclosure 208. The projection can be sized and shaped to prevent or reduce relative rotation between the accessory support 220 and the enclosure 208.

Figure 6:
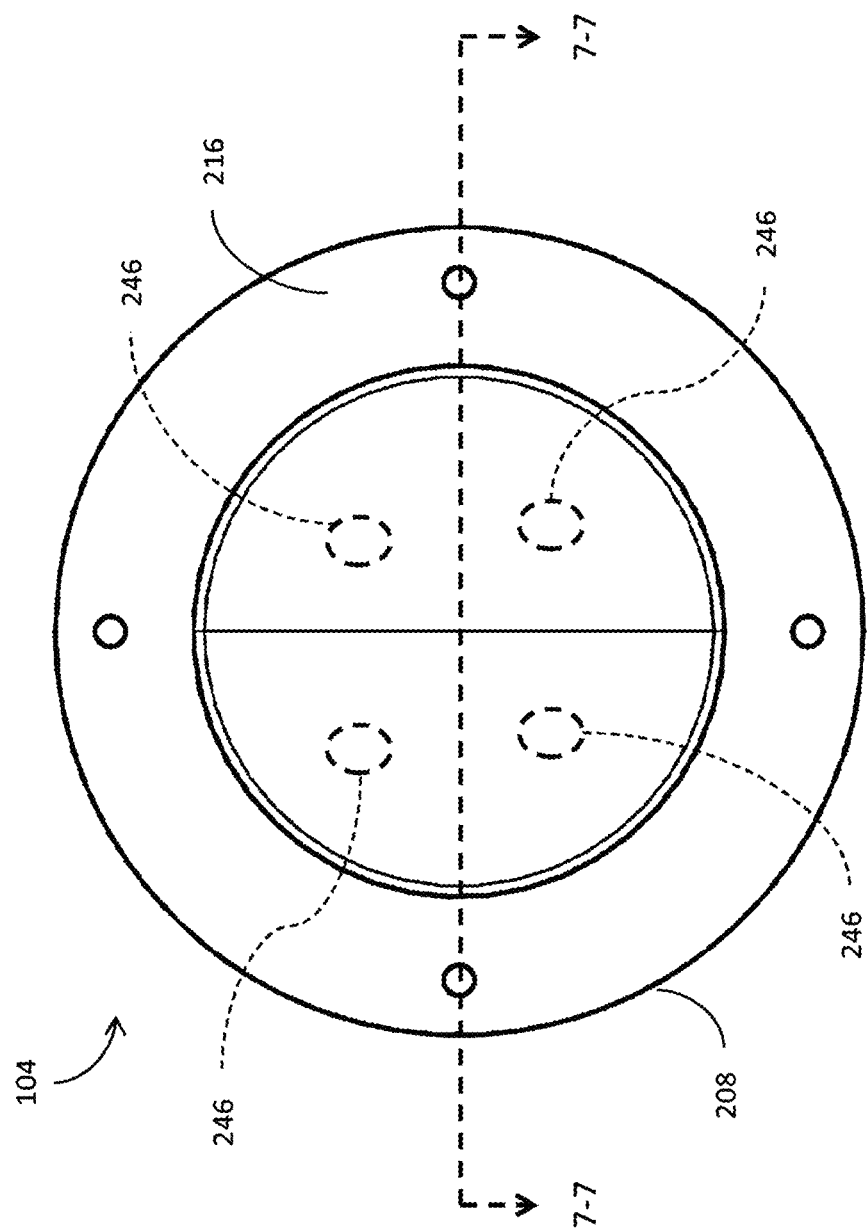
FIG. 6 is a top view of the accessory stand of FIG. 3 showing upper surfaces and upper side details thereof.

The free end 224 can take a variety of forms. In the illustrated embodiment the free end 224 includes a cap 240 disposed at an upper end of the outer surface 232. The cap 240 can have a relatively flat or low profile configuration. The cap 240 can be disposed generally transverse to the central axis 212. In one embodiment, the cap 240 has a generally planar lower surface 244 and has an arcuate upper surface. The arcuate upper surface can include a convex outer surface of the cap 240. The form of the upper surface and the lower surface 244 of the cap 240 enables a space to be provided therein. In one embodiment one or more lights 246 is provided in the cap 240 between the arcuate upper surface and the lower surface 244. FIG. 6 shows that there can be four lights, which may include light emitting diodes (LEDs) in four sections of the cap 240. LEDs can be provided in other patterns as well. The power for the LEDs can be provided via an electrical conveyance disposed within the accessory support 220, e.g., in a space within the outer surface 232 or within the guiding rail 238. The cap 240 can have a transverse dimension, e.g., a diameter that is more than fifty percent of the transverse dimension of the upper surface 216.

Figure 7:
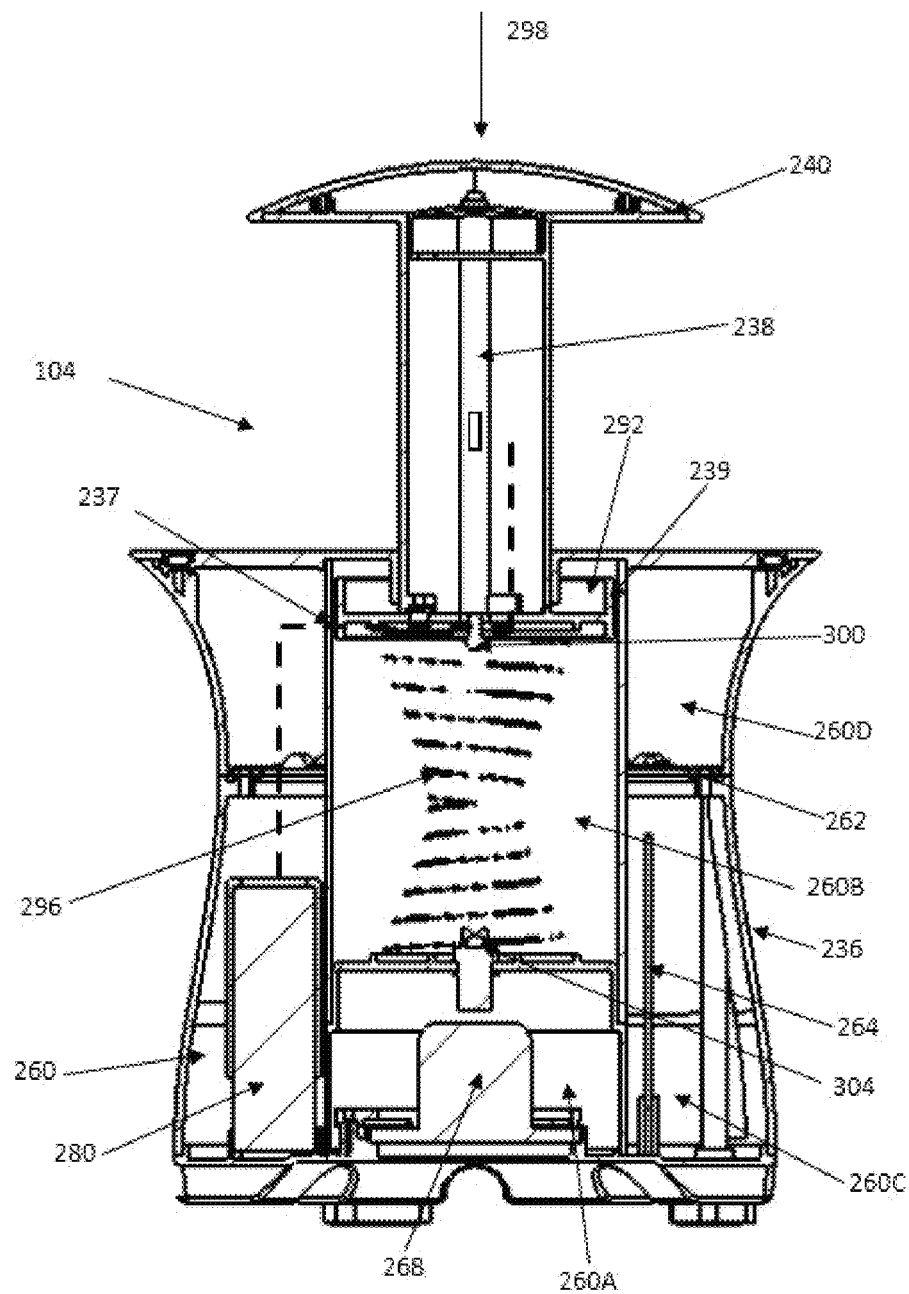
FIG. 7 is a cross-section of the accessory stand of FIGS. 3-6 taken at section plane 7-7 shown in FIG. 6.

FIG. 7 shows that controlled movement of the accessory support 220 into and out of the lower portion of the free standing accessory stand 104 can be facilitated by a bearing plate 239 disposed in the enclosure 208. The bearing plate 239 can be disposed generally transverse to the central axis 212 within the enclosure 208. The bearing plate 239 can include a cylindrical wall disposed about a circular inner member. An upper side of the circular member of the bearing plate 239 can mate with the outer surface 232.

As discussed above, the enclosure 208 can enclose one or more internal spaces of the free standing accessory stand 104. The internal spaces can be at least partially and in some cases entirely separated from each other. For example, a space 260 contained within the curved side wall 218 can be separated by internal walls into a plurality of smaller spaces. A speaker mounting space 260A adjacent to the lower wall 210 can be provided. Also, a retraction mechanism space 260B disposed between the speaker mounting space 260A and the upper surface 216. A lower peripheral space 260C can be disposed about the speaker mounting space 260A and about a portion of the retraction mechanism space 260B. An upper peripheral space 260D disposed around a portion of the retraction mechanism space 260B. While the space 260 has been shown to be subdivided into four distinct spaces, some of these spaces can be merged resulting in fewer internal spaces. Also, the space 260 can be further subdivided to provide separate areas for additional components within the enclosure 208. In some embodiments, the space 260 can fewer isolated areas with some of the foregoing spaces combined.

The bearing plate 239 can be disposed in the retraction mechanism space 260B within the enclosure 208. FIG. 7 shows that the bearing plate 239 can be disposed toward or at the upper end of the retraction mechanism space 260B when the free standing accessory stand 104 is in the first configuration 252. The bearing plate 239 is moveable within the retraction mechanism space 260B as the accessory support 220 is moved. When the accessory support 220 is moved into the retraction mechanism space 260B the bearing plate 239 moves downward toward the speaker mounting space 260A. When the accessory support 220 is moved out of the retraction mechanism space 260B the bearing plate 239 moves away from the space 260 toward the upper surface 216 of the enclosure 208. A variety of structures can be used to retain the bearing plate 239 in a position corresponding to the first configuration 252. In one embodiment a coil spring 296 or other resilient member is provided to retain the bearing plate 239 at or adjacent to the upper end of the retraction mechanism space 260B. In one embodiment a first end of the spring 296 acts on a wall defining the lower end of the retraction mechanism space 260B and the upper end of the speaker mounting space 260A. A second end of the spring 296 acts on a lower surface of the bearing plate 239. The spring 296 is configured such that as the bearing plate 239 moves downward away from an upper position in the retraction mechanism space 260B, the spring 296 stores strain energy. The strain energy in the spring 296 can be released if the bearing plate 239 is unconstrained. The free-state of the spring 296 and of the accessory support 220 is or corresponds to the first configuration 252 of the free standing accessory stand 104.

The second configuration 256 of the free standing accessory stand 104 is maintained by a retraction mechanism 292. The retraction mechanism 292 facilitates motion of the accessory support 220 into the lower portion of the free standing accessory stand 104 within the enclosure 208. For example, the user can push downward the cap 240 in the direction of the arrow 298 shown in FIG. 7. As the accessory support 220 moves into the retraction mechanism space 260B the bearing plate 239 slides down along a wall surrounding the space 260B. The distance between the lower surface of the bearing plate 239 and the upper surface of the enclosure 208 between the speaker mounting space 260A and the retraction mechanism space 260B is reduced and the spring 296 is compressed. When the accessory support 220 is fully advanced into the retraction mechanism space 260B a force in a direction opposite the direction of the arrow 298 acts on the bearing plate 239 and would urge the accessory support 220 upward back toward the first configuration 252 of the free standing accessory stand 104.

Figure 7A:
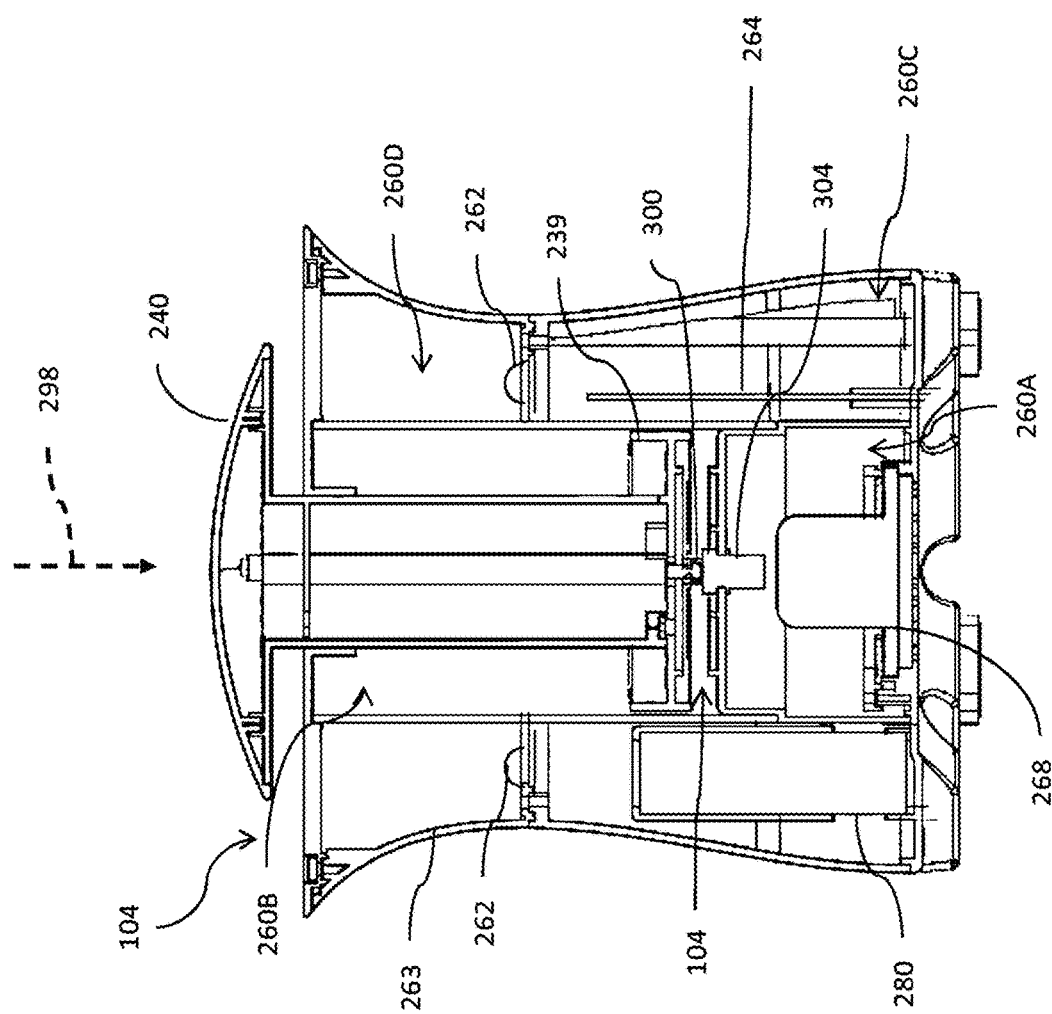
FIG. 7A shows engagement of a retraction mechanism of the accessory stand of FIG. 3, the retraction mechanism being shown in a retracted configuration.

FIGS. 7 and 7A show that the retraction mechanism 292 can include a locking device that includes a first locking member 300 disposed on and projecting away from a lower side of the bearing plate 239. The first locking member 300 can include a hook structure, e.g., an elongate projection with a transverse ledge or length at a free end thereof. A second locking member 304 can be disposed at the lower end of the retraction mechanism space 260B. The second locking member 304 can include a recess at or coupled with a wall of the enclosure 208 bounding the lower end of the retraction mechanism space 260B. The second locking member 304 can include a recess configured to receive the first locking member 300. For example, the first locking member 300 and the second locking member 304 can be disposed along the central axis 212 in one embodiment. An opening into the recess of the second locking member 304 can be located at an elevation just above the position at which the accessory support 220 is configured to be retained in second configuration 256. As the first locking member 300 is advanced to this location the free end of the first locking member 300 enters the opening into the recess of the second locking member 304. Further advancement of the first locking member 300 into the second locking member 304 causes the free end to be trapped by the second locking member 304. If the free end of the first locking member 300 includes a hook structure a ledge or downward facing structure can be configured to abut the hook structure to resist the upward forced of the spring 296. The hook structure of the first locking member 300 can include an upward facing surfaced to abut the downward facing surface of the second locking member 304. In one embodiment, the accessory support 220 is configured such that once the first locking member 300 and the second locking member 304 are engaged the accessory support 220 will be held in position absent further actuation as shown in FIG. 7A.

The retraction mechanism 292 can include a disengagement device or can facilitate a disengagement action to be provided to allow the free standing accessory stand 104 to transition from the second configuration 256 to the first configuration 252. The first locking member 300 can be disengaged from the second locking member 304 by pressing the cap 240 downward along the direction of the arrow 298 when the free standing accessory stand 104 is in the second configuration 256. For example, the downward motion of the cap 240 can cause corresponding downward motion of a hook structure of the first locking member 300 relative to the second locking member 304. Such downward motion can cause the first locking member 300 to deflect away from the second locking member 304 causing engaging or locking surfaces of the first locking member 300 and second locking member 304 to be misaligned in the vertical direction which can allow the first locking member 300 to move upwardly along the first locking member 300 such that engaging surface of the first locking member 300 and the second locking member 304 are not engaged. Additional configurations of locking devices are discussed below in connection with FIGS. 7B and 7C.

As discussed above, the space 260 in the enclosure 208 can be subdivided into separate spaces that can retain different functional components of the free standing accessory stand 104. The speaker mounting space 260A can be located at a lower portion of the free standing accessory stand 104 and can retain the speaker 268 therein. The speaker mounting space 260A can be located between the retraction mechanism space 260B and the lower wall 210. The free standing accessory stand 104 can be configured to maximize the volume emitted therefrom by providing the apertures 272 between the speaker mounting space 260A and the open area defined by the gap between the table shelf or other surface that the feet 204 rest upon and the lower wall 210. The speaker mounting space 260A is advantageously made with a volume not much larger than that of the speaker 268 such that sound generated by the speaker and propagating away from the speaker 268 will be redirected back toward and out of the apertures 272. Also, the lower side of the free standing accessory stand 104 preferably includes hard surfaces such that the sound can be propagate out around the ground support portion 200 of the free standing accessory stand 104 rather than being muffled thereunder.

The lower peripheral space 260C can be annular in shape extending entirely around the periphery of the enclosure 208. The lower peripheral space 260C can extend between the curved side wall 218 and the speaker mounting space 260A in one portion. The lower peripheral space 260C can extend between the curved side wall 218 and the retraction mechanism space 260B in another portion. The lower peripheral space 260C has a larger dimension than the upper peripheral space 260D along the central axis 212. The lower peripheral space 260C is configured to retain elongate components. For example, the lower peripheral space 260C can retain a power source 280. The power source 280 can include a battery, such as a rechargeable battery. The power source 280 can include an AC power unit for powering the speaker 268 or other electrical components from wall power source. The power source 280 can include both an AC power unit and one or more rechargeable or other type of battery. The lower peripheral space 260C can include a plurality of components in some embodiments. For example a first component 264 can be mounted in the lower peripheral space 260C. The first component 264 can be a component with a high aspect ratio that is a height that greatly exceeds the width thereof. Accordingly the lower peripheral space 260C can be made taller (along the central axis 212) than is the upper peripheral space 260D to accommodate the first component 264.

As discussed further below, the free standing accessory stand 104 can in one mode receive a wireless transmission via a Bluetooth or other sort of antenna of audio content to be amplified and emitted by the speaker 268. The transmission can be transmitted by a cellphone or other mobile device having Bluetooth or other close range transmission protocol. The transmission can come directly from the portable accessory 108. The transmission can come to the free standing accessory stand 104 indirectly from a cellphone or other mobile device via the portable accessory 108. The transmission can be directed from the free standing accessory stand 104 to the portable accessory 108 and from a cellphone or another source.

The space 260 in the enclosure 208 can also be subdivided into the upper peripheral space 260D which can contain one or more components. In the illustrated embodiment, the upper peripheral space 260D can enclose one or a plurality of light 262. The light 262 can include LED lights mounted to a wall defining a boundary of, e.g., a lower boundary of, the upper peripheral space 260D. The lights 262 can be arranged in a regular pattern, e.g., in an annular array with a light 262 located every ten to twenty degrees about a circumference. The lights 262 can be disposed about one-half of the radial distance between inner and outer walls bounding the upper peripheral space 260D. The light or lights 262 can be powered by the power source 280 disposed in the lower peripheral space 260C. Accordingly, electrical conveyances can be provided along or to a wall separating the lower peripheral space 260C from the upper peripheral space 260D. In other embodiments, electrical conveyances can be provided between adjacent or remote segments of the space within the enclosure 208.

An upper portion of the curved side wall 218 can comprise a transmissive portion 263. The transmissive portion 263 can bound the upper peripheral space 260D such that an outer wall radially outward of the light or lights 262 can transmit light out of the enclosure 208. The transmissive portion 263 can be clear in one embodiment. In other embodiments, the transmissive portion 263 is translucent such that the utilitarian components inside the space 260 are not visible but the light generated by the light or lights 262 is emitted from the free standing accessory stand 104 as desired. A lower portion of the curved side wall 218 below the transmissive portion 263 can be configured with the same material or structure as the transmissive portion 263. The lower portion of the curved side wall 218 below the transmissive portion 263 can be configured with less or non-transmissive materials as appropriate.

FIG. 7B shows schematically a retraction mechanism 292A according to another embodiment. The retraction mechanism 292A is configured to enable the accessory support 220 to be retracted and to be retained in the retraction mechanism space 260B. This embodiment is similar to that of FIGS. 7 and 7A except as described differently below. The bearing plate 239 is disposed in the retraction mechanism space 260B and is coupled with a first locking member 300A. The bearing plate 239 can be directly coupled with the first locking member 300A or can be able to move some amount before the bearing plate 239 engages the first locking member 300A. The first locking member 300A can include a transverse extent that corresponds to but may be somewhat smaller than the transverse extent of the bearing plate 239. The first locking member 300A also can include a pin at a lower end thereof configured to engage a second locking member 304A. The second locking member 304A can include a position limiting track. The track can include a convex surface 312 of initial contact and a concave resting surface 314. The convex surface 312 can be disposed below an extended resting position of the accessory support 220. The convex surface 312 can curve away from the central axis 212 toward a side-wall of the retraction mechanism space 260B. The concave surface 314 can be oriented downwardly.

FIG. 7B, right image, illustrates operation of the first locking member 300A and the second locking member 304A is illustrated by a series of circles along the convex surface 312. The first locking member 300A is moved down into initial contact with the convex surface 312 as shown by the circle at the highest elevation. The second through fourth circles illustrate the trajectory of the first locking member 300A along the convex surface 312 of the second locking member 304A. The lower-most (fifth) circle shows a point at which the motion of the first locking member 300A transitions from a generally downward direction around the convex surface 312 to an upward motion as illustrated by the next circle which is located within the concave surface 314. Motion between the location of the fifth and sixth circle can be aided by the spring 296. That is the motion of the accessory support 220 and the bearing plate 239 along from the first to the fifth circle all correspond to a compression of the spring 296. Motion from the fifth to the sixth circle corresponds to at least some upward direction (in a direction generally corresponding to the central axis 212) movement. This upward direction movement corresponds to some relaxing of the spring or release of strain energy. FIG. 7B, right image, shows the first locking member 300A at rest in the concave surface 314 of the second locking member 304A.

Disengaging the first locking member 300A from the second locking member 304A can be achieved by pushing the accessory support 220 (e.g., by pressing on the cap 240) which moves the second locking member 304A out of the concave surface 314. In one embodiment a lateral load by a second spring or other means can urge the first locking member 300A away from the convex surface 312 and the concave surface 314 to an opposite return surface. The first locking member 300A (and the accessory support 220 to which it is attached) can be allowed to move upward to an extended rest position as shown in the left image of FIG. 7B.

FIG. 7B shows that the retraction mechanism 292A can include one or more trapping arms 310, providing additional retention security. The trapping arms 310 can be extended and disposed away from a lower portion of the accessory support 220 in the extended position of FIG. 7B, left image. The trapping arms can include a hook-like or convex form in which free ends thereof are angled or disposed toward the accessory support 220. The concave form of the trapping arms 310 provides that as the accessory support 220 is advanced into the retraction mechanism space 260B the free ends of the trapping arms 310 come toward and eventually overhang the bearing plate 239 and may in some cases engage a lower portion of the outer surface 232 to provide compression and clamping thereof. The trapping arms 310 are optional and can be provided for an extra measure of retention but are not required.

Figure 7C:
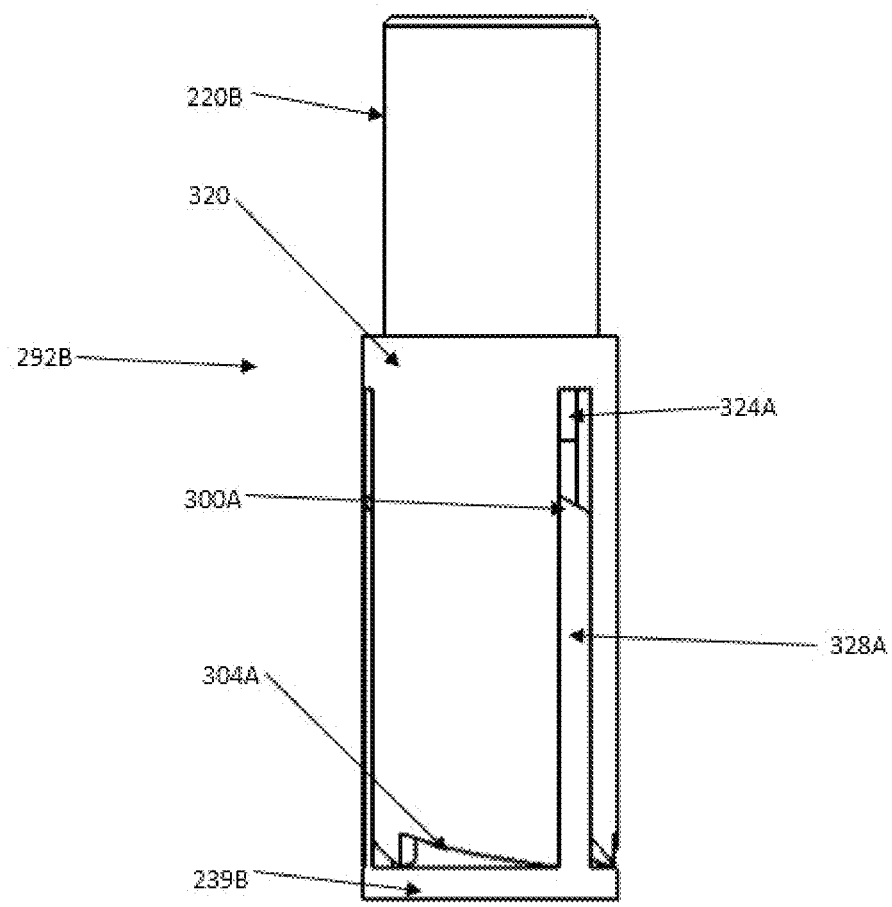
FIG. 7C shows another embodiment of a retraction mechanism in an extended configuration.

FIG. 7C shows a retraction mechanism 292B that can be incorporated into the free standing accessory stand 104. The retraction mechanism 292B can include an accessory support 220B that is similar to the accessory support 220 except as described differently. The accessory support 220 can be coupled with the cap 240. The accessory support 220B can be rotatably coupled with a bearing plate 239B. The accessory support 220B can include an actuator 324A. The accessory support 220B can also include an actuator 324B. In some embodiments, the accessory support 220B includes three or four actuators similar to the actuator 324A. The bearing member 239B can be similar to the bearing plate 239 except as described differently. The bearing member 239B can include a rib 328A and a rib 328B. A slanted face of the rib 328A can include a first locking member 300A. A slanted face of the rib 328B can include a first locking member 300B. In some embodiments, the bearing member 239B includes a same number of ribs as the accessory support 220B includes actuators, e.g., three or four ribs. As discussed further below, bearing member 239B is rotatably coupled with the accessory support 220B such that the actuator 324A is directly coupled with the rib 328A in a first extended configuration 332, illustrated in FIG. 7C and the actuator 324A is directly coupled with the rib 328B in a second extended configuration 356 (discussed below).

The retraction mechanism 292B includes or interacts with an internal wall 320. The internal wall 320 can be a wall of the enclosure 208 that defined the retraction mechanism space 260B therein. In some embodiments, the internal wall 320 is a separate structure from the wall of the enclosure 208 that defines the retraction mechanism space 260B. The internal wall 320 can include a second locking member 304A. The second locking member 304A can include an elongate slot and a plurality of adjacent slanted faces. The elongate slot can be sized to slideably receive the actuator 324A. If more than one elongate slot is provided, the slot can also be configured to slideably receive the actuator 324B. The slanted faces of the second locking member 304A can be configured to selectively retain the first locking member 300A of the rib 328A. If more than one locking member is provided, the slanted faces of the second locking member 304A also can be configured to selectively retain the first locking member 300B of the rib 328B in retracted configuration as discussed further below.

Figure 7D:
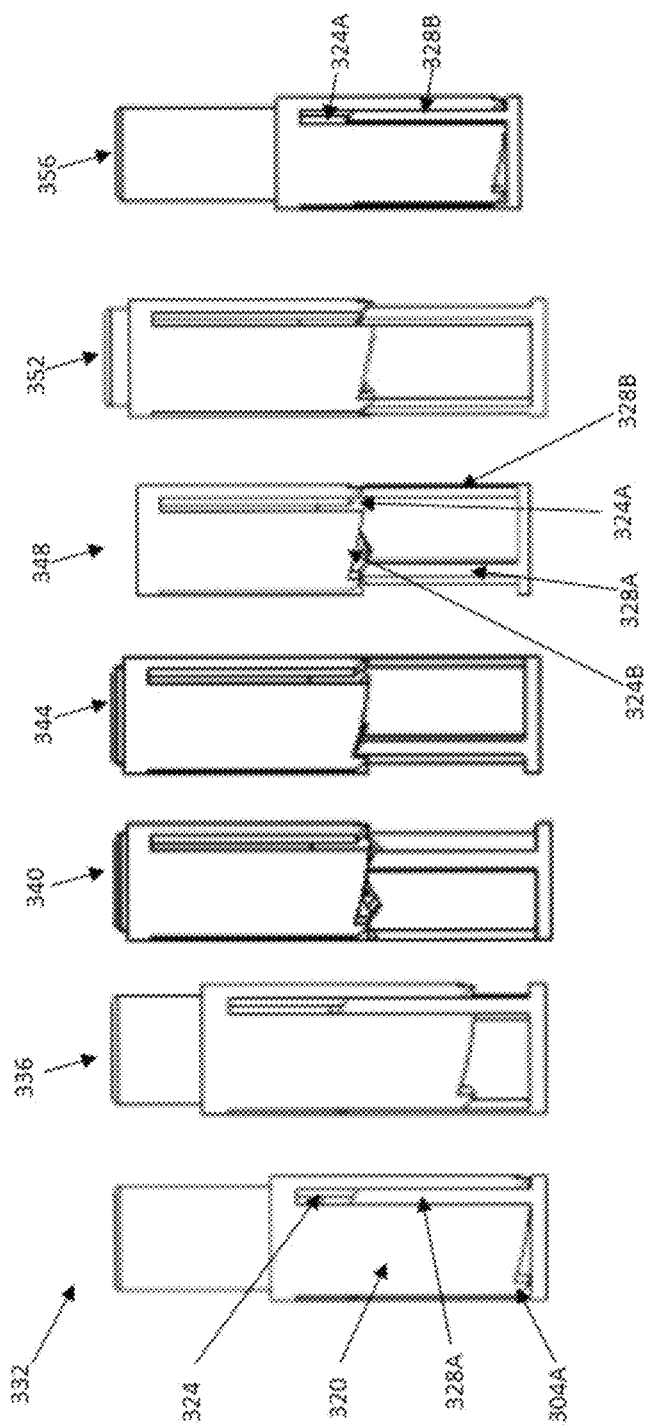
FIG. 7D shows phases of retraction and extension of the retraction mechanism of FIG. 7C.

FIG. 7D shows seven positions of the retraction mechanism 292B according to one embodiment thereof. In a first extended configuration 332 the rib 328A is disposed in a slot of the internal wall 320. For ease of illustration the enclosure 208 and the retraction mechanism space 260B are not shown, but one skilled in the art will understand how these structures are related to the illustration of FIG. 7D in view of the description herein. The first extended configuration 332 also provides that the first locking member 300A corresponding to the slanted face of the rib 328A is disposed against a slanted face of the actuator 324A. The first extended configuration 332 corresponds to the first configuration 252 of the free standing accessory stand 104. A first retracting configuration 336 corresponds to a position as the accessory support 220B is being retracted using the retraction mechanism 292B. The actuator 324A acts through a slanted face thereof on the first locking member 300A which includes a slanted face of the rib 328A.

FIG. 7D also shows a second retracting configuration 340 following the first retracting configuration 336. In the second retracting configuration 340 the first locking member 300A including a slanted face of the rib 328A emerges from the slot of the internal wall 320 and upon so doing the bearing member 239B rotates relative to the internal wall 320 such that the rib 328A moves onto a slanted faces of the second locking member 304A. The first locking member 300A then comes into a rest position in a notch at a circumferential end (left end in the view) of the slanted surface. The retracted configuration 344 shows the rib 328A in a rest state in this notch. In this rest state the retraction mechanism 292B retains the accessory support 220B in a low profile configuration, corresponding to the second configuration 256 (FIGS. 4 and 7A).

FIG. 7D shows a first extending configuration 348 in which an actuator 324B acts on the rib 328A to displace the first locking member 300B out of the notch of the second locking member 304B. After the first locking member 300B is clear of the notch, the rib 328A is allowed to rotate circumferentially (to the left in the image) onto a second slanted surface of the second locking member 304B. In a second extending configuration 352 the first locking member 300A including a slanted face of the rib 328A comes to rest on the second slanted face of the second locking member 304A and slides therealong until the rib 328A is disposed at and thereafter received in a second slot of the internal wall 320. Upon reaching the second slot, which is circumferentially spaced from the first slot (to the left in the image), the rib 328A can be received in the second slot. Also, the rib 328B can be received in the first slot as shown in the second extended configuration 356. In this position the rib 328B comes to rest on the actuator 324A.

Figure 5:
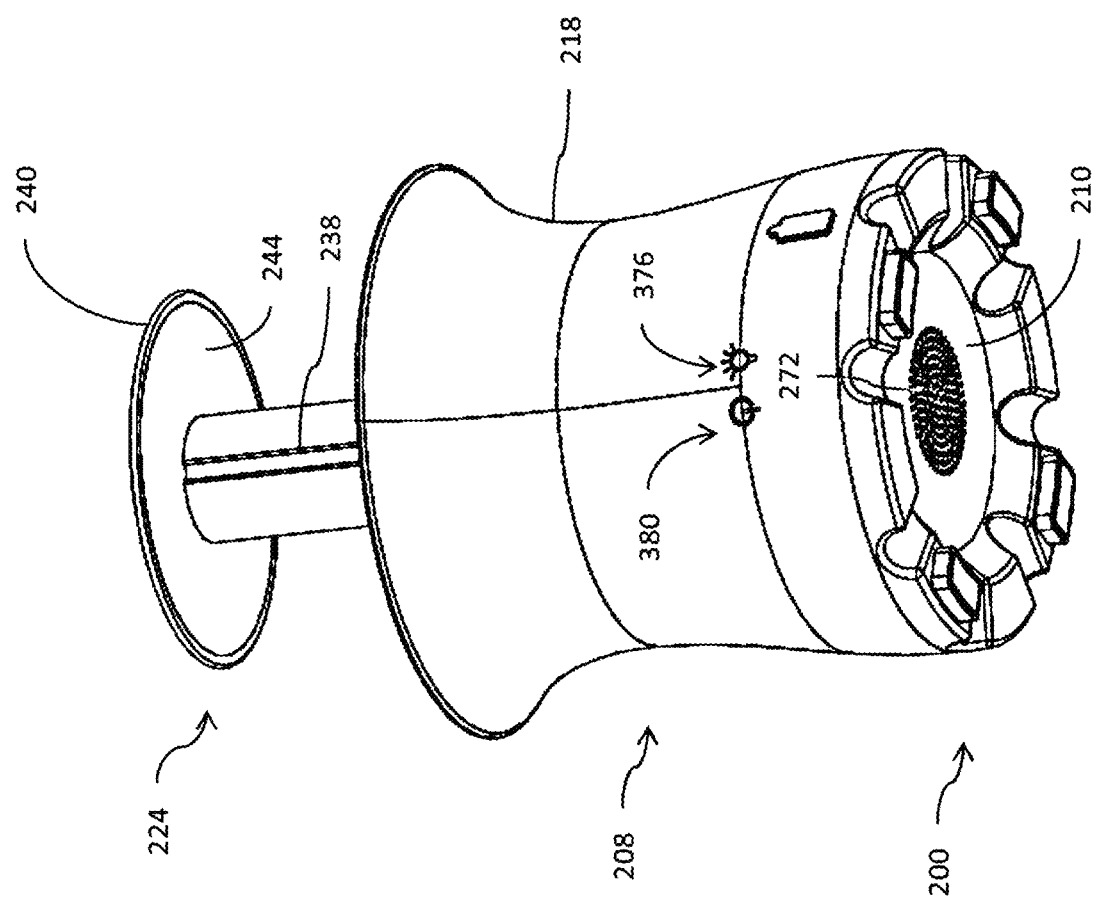
FIG. 5 is a bottom perspective view of the accessory stand of FIG. 3 showing lower surfaces and lower side details thereof.

FIGS. 3, 4, and 5 show that the free standing accessory stand 104 includes control buttons 380 that facilitate operation thereof. The control buttons 380 can include a power button to turn on components therein. The control buttons 380 can include mode activation buttons, e.g., to cause wireless engagement between the free standing accessory stand 104 and the portable accessory 108 and/or between the free standing accessory stand 104 and another wireless device such as a mobile phone.

Figure 8:
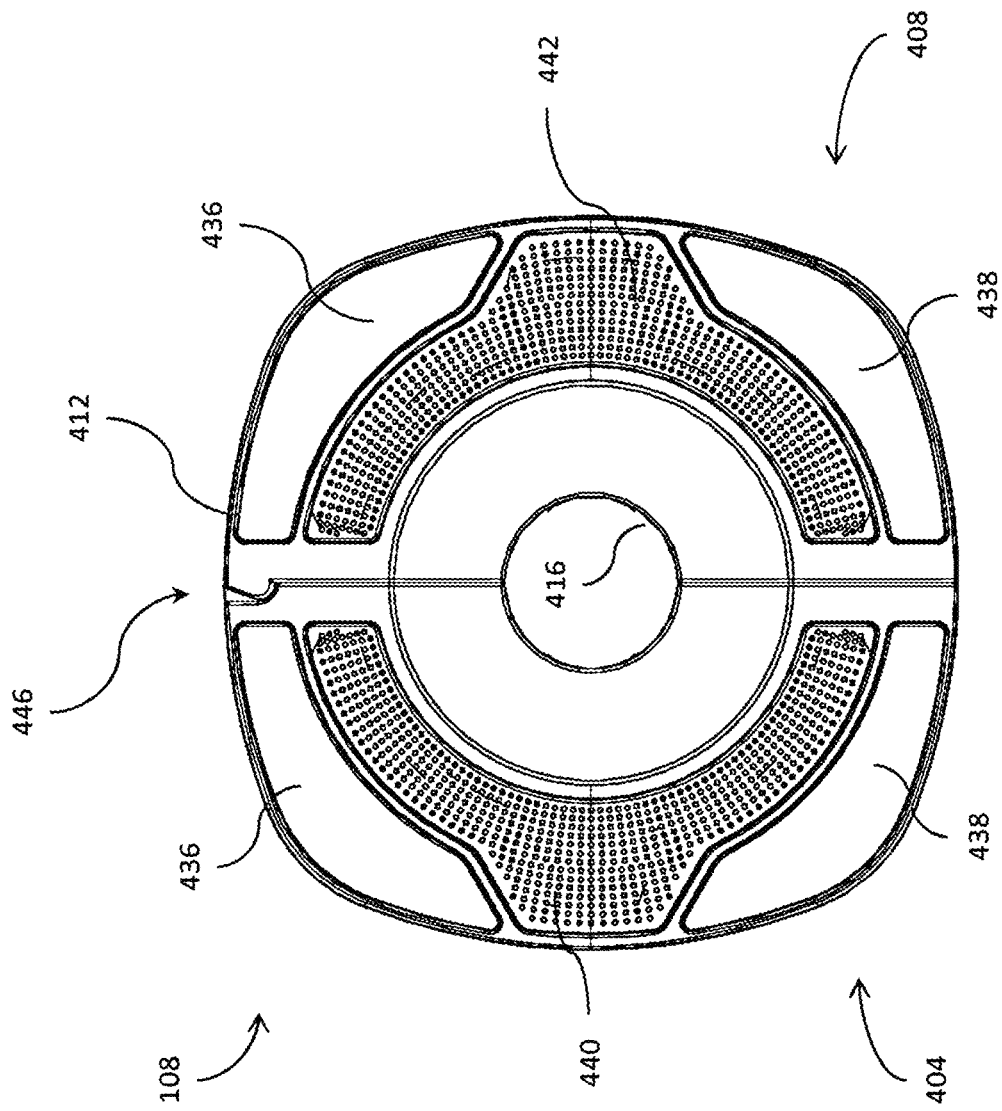
FIG. 8 is a top side view of one embodiment of the portable accessory of FIG. 1.
Figure 9:
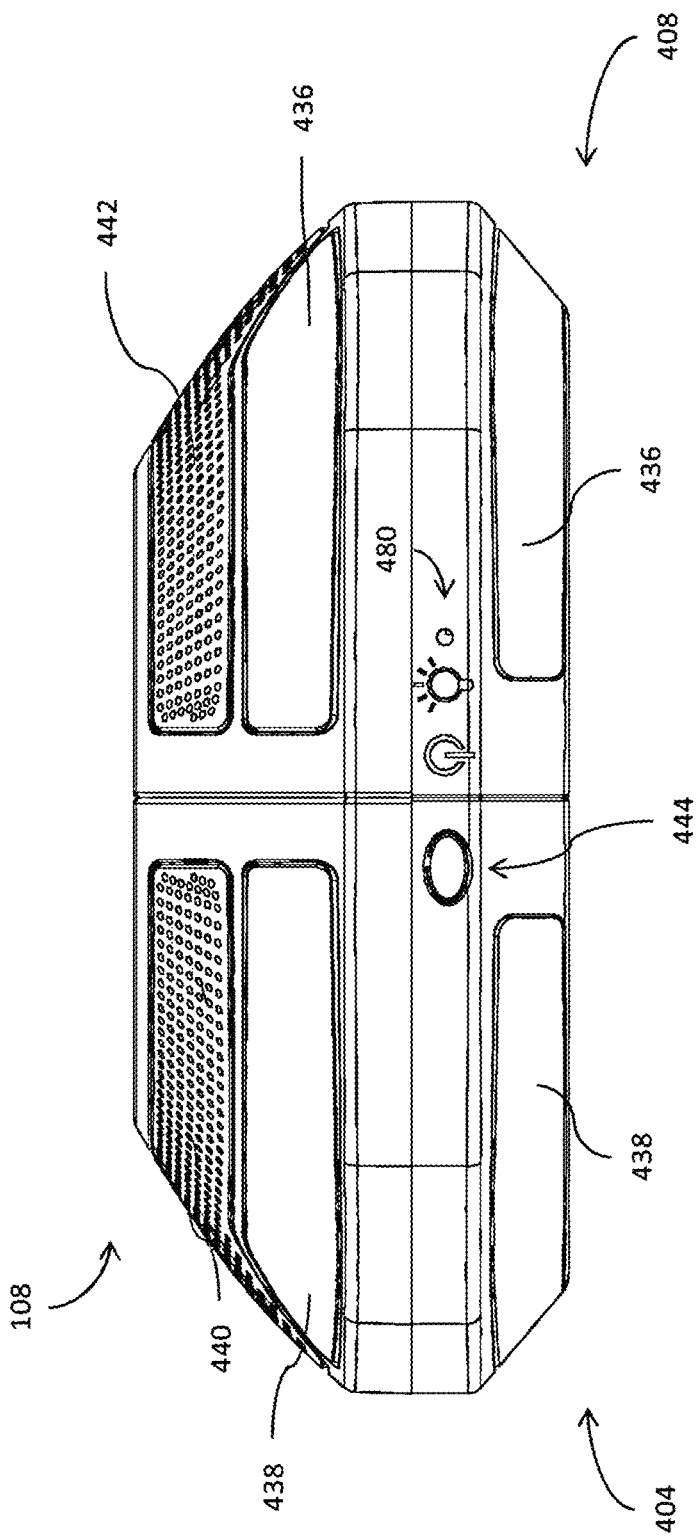
FIG. 9 is a front view of the portable accessory of FIGS. 1 and 8.
Figure 10:
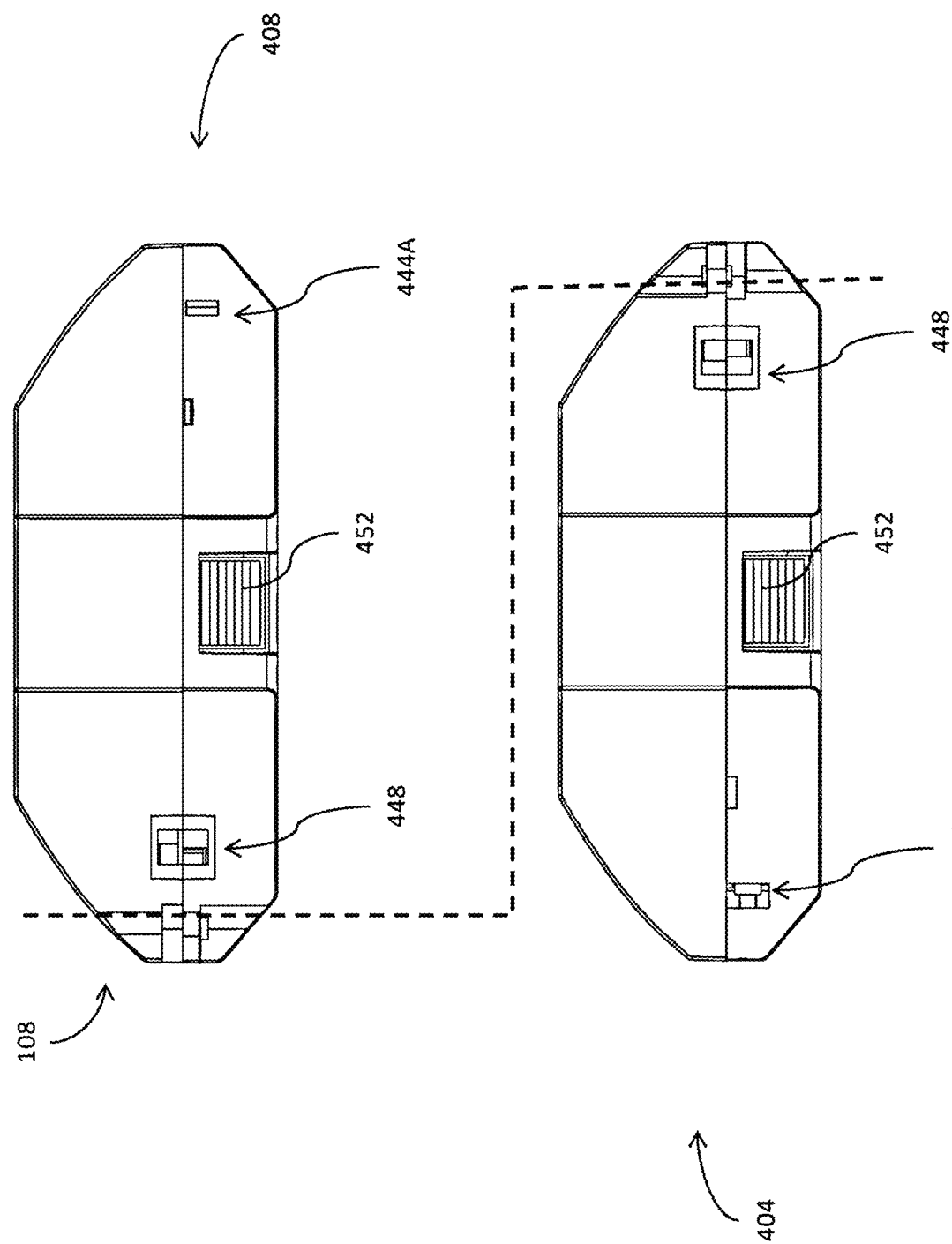
FIG. 10 is an exploded view of the portable accessory of FIGS. 1 and 8.
Figure 11:
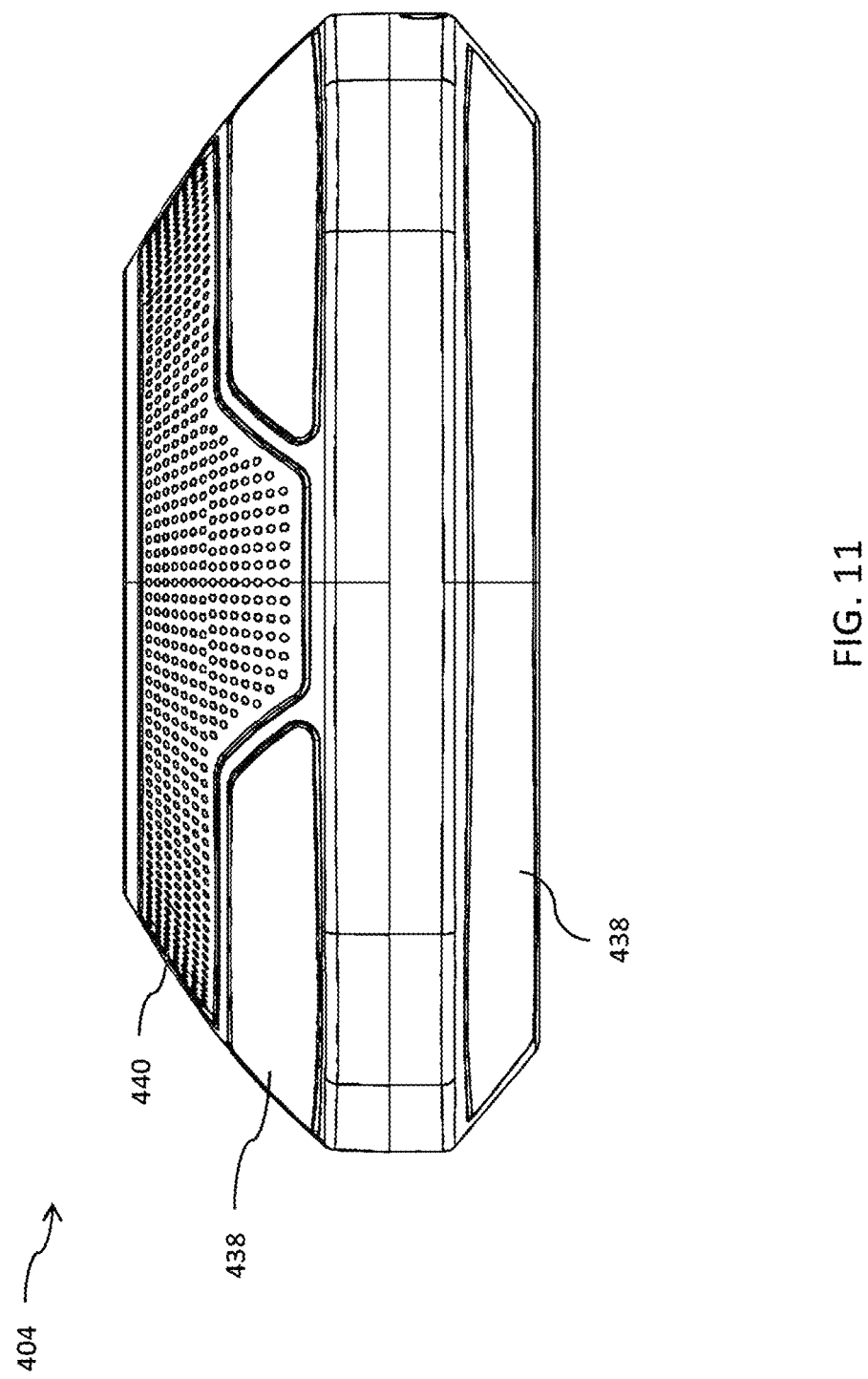
FIG. 11 is a side view of the portable accessory of FIGS. 1 and 8.
Figure 11A:
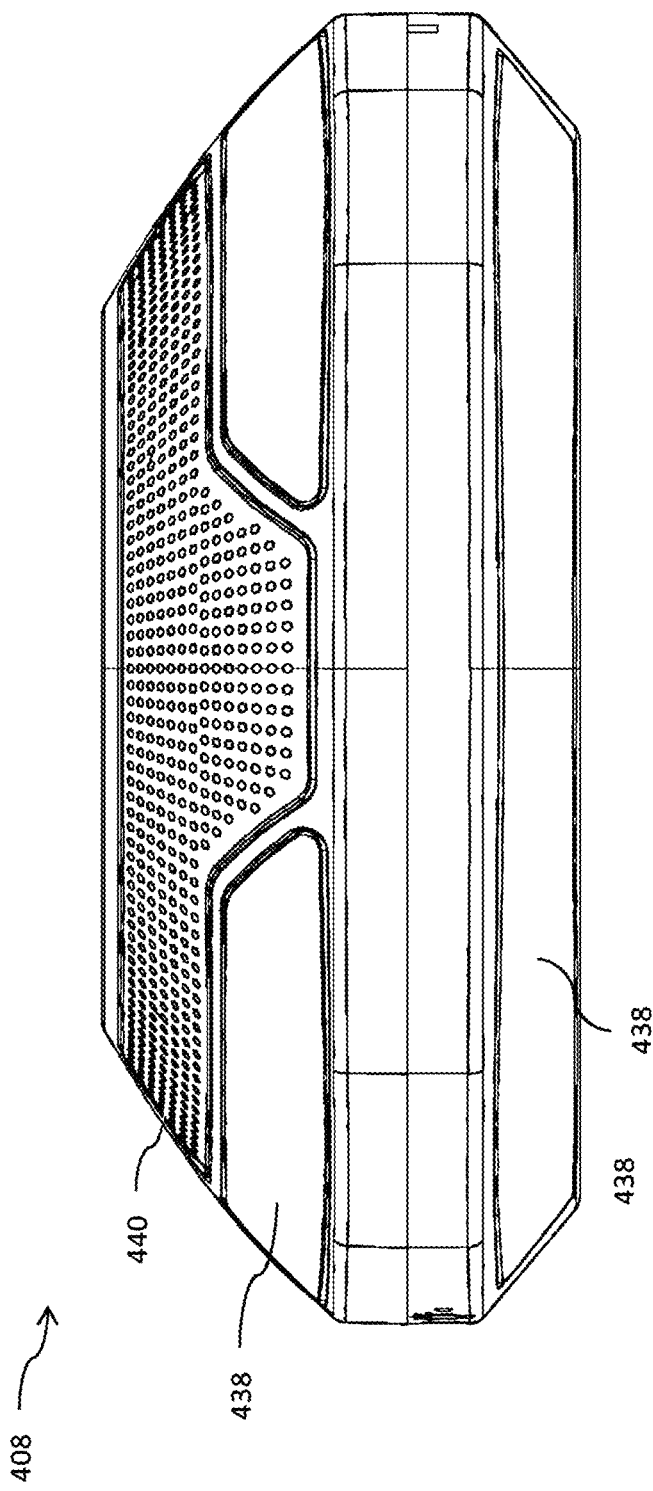
FIG. 11A is another side view of the portable accessory of FIGS. 1 and 8.

FIGS. 8-13 show additional details of the portable accessory 108. As discussed above, the portable accessory 108 includes the first shell 404 and the second shell 408. The shells 404, 408 can be joined to form an outer periphery 412 and an inner periphery 416. The outer periphery 412 can comprise a continuous outer periphery. The inner periphery 416 can comprise a continuous inner periphery. The outer periphery 412 and the inner periphery 416 can be configured to be disposed around the outer surface 232 of the accessory support 220 or to receive the pole portion 90 which can be part of an umbrella. FIGS. 9-10 show that a clasp 444 can retain the shell first shell 404 and the second shell 408 in the closed periphery configuration. The clasp 444 can include a hook 444A disposed on the second shell 408 and a trapping recess disposed on the first shell 404. The hook can be received in the trapping recess to engage a trapping structure 444C disposed within the first shell 404. The trapping structure can be actuated by a push button 444D disposed on the outer periphery of the first shell 404 (see FIG. 9).

A peripheral portion opposite the location of the clasp 444 includes a pivot connection 446 disposed between the first shell 404 and the second shell 408. The pivot connection 446 can be provided by an axle 447 coupled to the first shell 404, and to the second shell 408 of the enclosure 400. The axle 447 is disposed along the dashed line in FIG. 10. The axle 447 allows rotation up to an extent of a limiter 448. The limiter 448 can include enlarged ends disposed within the interior of each of the shells 404, 408 and an elongate or arcuate portion disposed between the enlarged ends. The limiter 448 allows rotation of the shells 404, 408 relative to each other up about the axle 447 until the enlarged ends contact inside surfaces of the shells 404, 408.

Figure 12B:
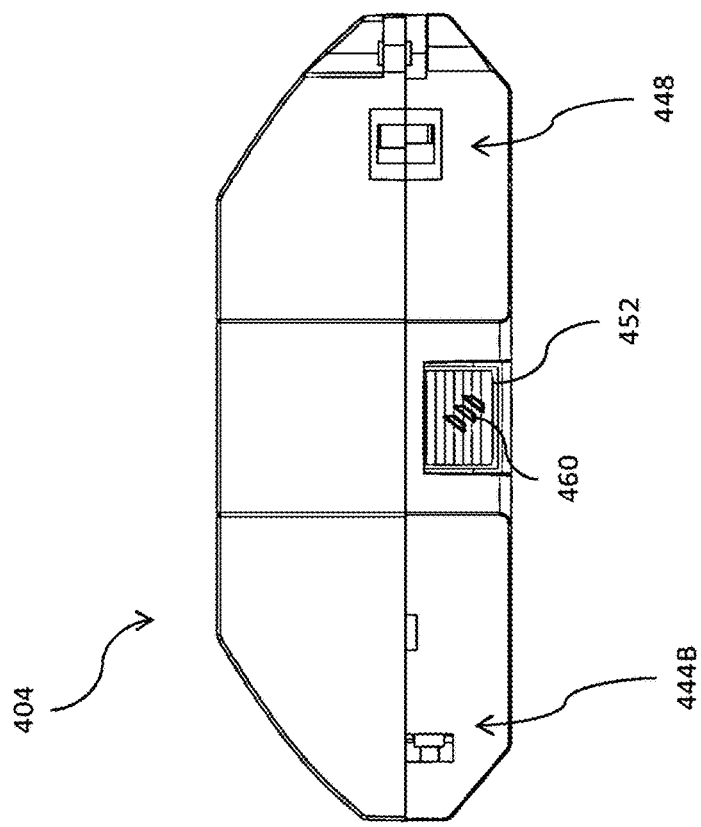
FIG. 12B shows a first shell of one embodiment of the portable accessory of FIGS. 1 and 8 having contacts configured to engage contacts on the accessory stand shown in FIG. 3 for providing power to the portable accessory.
Figure 12A:
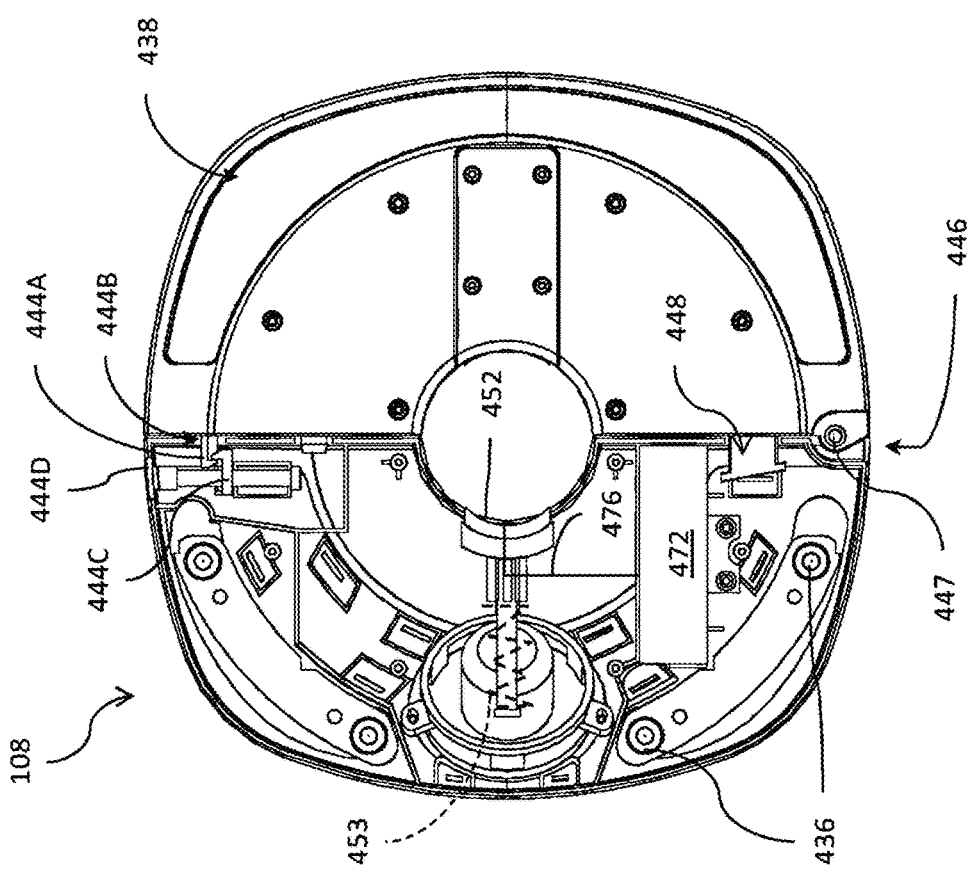
FIG. 12A is a bottom view with a portion of the enclosure of the portable accessory of FIGS. 1 and 8 removed to show internal components.
Figure 13:
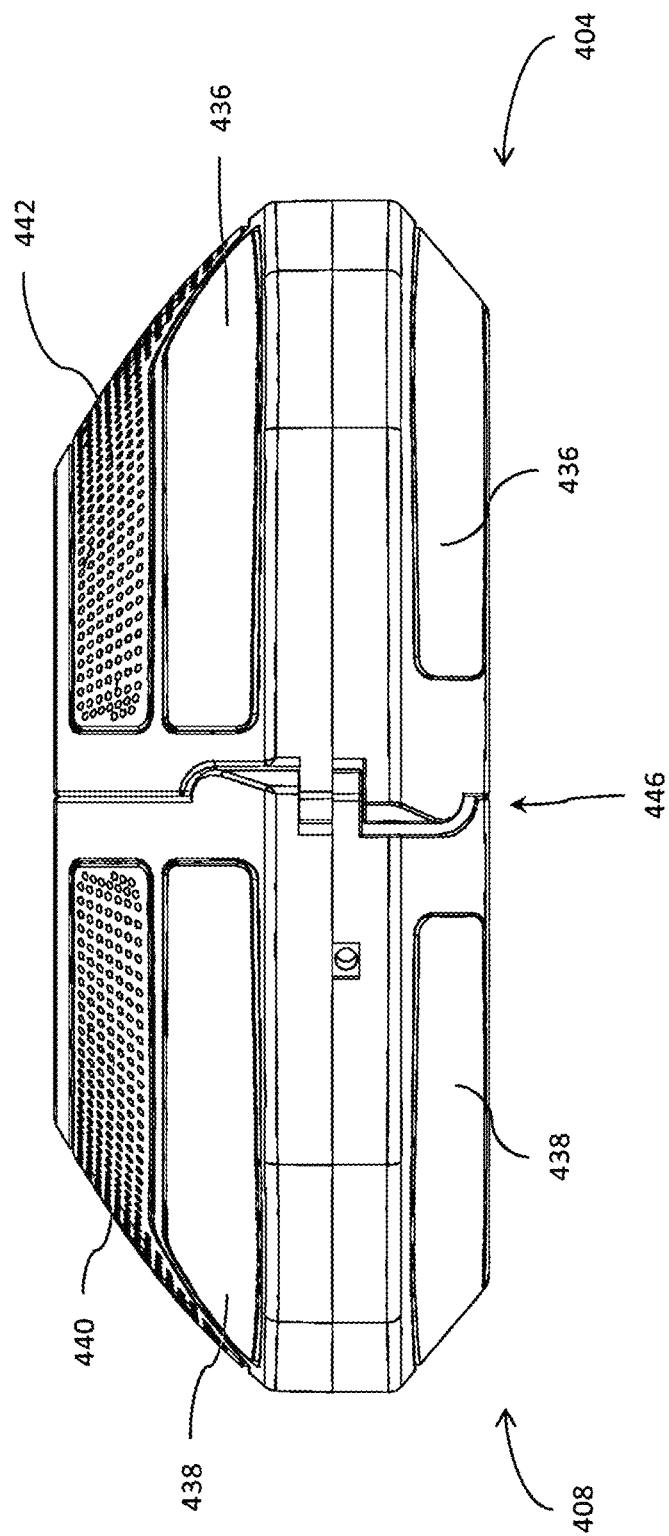
FIG. 13 is a rear view of the portable accessory of FIGS. 1 and 8.

The portable accessory 108 includes one or a plurality, e.g., two grippers 452. FIG. 12A shows one of the two grippers 452 by removing top portions of the enclosure 400. FIG. 12B shows that the grippers 452 can include ridged faces that can be somewhat compressible but generally are stiff. The faces are moveable toward and away from a center of a space within the inner periphery 416 of the enclosure 400. In a rest state the faces of the grippers 452 are disposed toward the center of the space within the inner periphery 416. The grippers 452 can be are urged away from the center of the space within the inner periphery 416. Movement of the grippers 452 can be guided by a spring 453 or other resilient members disposed between the faces of the grippers 452 and an internal surface of the first shell 404 and the second shell 408 (or if just one gripper is provided only one of the shells). In one technique, the first and second shells 404, 408 are moved away from each other at least on the side of the clasp 444. The outer surface 232 or the pole portion 90 can be passed into the inner periphery 416. The separation between the opposing grippers 452 or between one gripper 452 and an opposing wall of the inner periphery 416 is less than the diameter of the accessory support 220 or the pole portion 90. Closing the first shell 404 onto the second shell 408 causes the outer surface 232 or the pole portion 90 to compress the grippers 452 away from the center of the space in within the inner periphery 416, e.g., to move the grippers 452 toward the inner periphery 416. The spring is configured such that when compressed by the pole portion 90, the spring creates a force between the face or faces of the gripper(s) 452 and the pole portion 90 to enable the portable accessory 108 to be self-supporting thereon. The spring also can create a force between the face or faces of the grippers 452 and the outer surface 232 of the free standing accessory stand 104 sufficient to enable the portable accessory 108 to be self-supporting thereon.

The portable accessory 108 preferably includes an accessory to provide enjoyment by a user. For example, the portable accessory 108 can include a light 436 disposed on one or both of the first shell 404 and the second shell 408. The light 436 can include an assembly including one or more light emitting diodes (LEDs) and a light cover 438. The light cover 438 can be configured to protect the LED lights. The light cover 438 can be translucent to give the appearance of more diffuse light. FIG. 8 shows that the enclosure 400 can include four light cover 438 on a lower surface, e.g., directing light downward when the portable accessory 108 is mounted on the pole portion 90. FIGS. 12 and 12A show that the enclosure 400 can include two light cover 438 on a lower surface. The lower surface is the surface facing downward on the free standing accessory stand 104. The lower surface can be one that faces upward on the pole portion 90, e.g., directing light upward when the portable accessory 108 is mounted on the pole portion 90 in the orientation shown in FIG. 2. The portable accessory 108 also can be mounted on the pole portion 90 in an inverted compared to that shown in FIG. 2, e.g., with the side shown in FIG. 8 facing upwards.

The lights 436 disposed on the top of the enclosure 400 can include one or an array of LED lights. Preferably an array of lights is spaced out about the outer periphery 412 within arcuate light compartments in each of the first shell 404 and the second shell 408.

The portable accessory 108 also can include a speaker 440 disposed on one or both of the first shell 404 and the second shell 408. The speaker 440 can be disposed within the enclosure 400 behind a speaker cover 442. The speaker cover 442 can provide protection for the speaker 440 while not preventing the sound from being emitted to the fullest extent of the power of the speaker. FIG. 8 shows that the enclosure 400 can include a speaker 440 disposed behind a speaker cover 442 on each of the first shell 404 and the second shell 408.

FIGS. 3, 7, and 12B illustrate that in certain embodiments the free standing accessory stand 104 can be used to supply charge to a power source such as a battery 472 in the portable accessory 108 to recharge the battery 472. FIG. 3 shows the free standing accessory stand 104 can include a first electrical contact 236 disposed on the accessory support 220. The first electrical contact 236 can be disposed on the outer surface 232 such that the first electrical contact 236 is accessible when the accessory support 220 is in the first configuration 252, e.g., extended from the enclosure 208 above the upper surface 216. The first electrical contact 236 can be coupled with an electrical conveyance 237 that coveys current from a power source within or coupled to the free standing accessory stand 104. The electrical conveyance 237 can convey current from the power source 280 in one embodiment and in one mode. The electrical conveyance 237 can be coupled with an AC port 237A in one embodiment. The AC port 237A can be coupled with wall current such that electrical current can be supplied to the first electrical contact 236 without drawing down power in the power source 280 disposed within the enclosure 208.

The battery 472 can be charged in one embodiment by enclosing the outer surface 232 within the inner periphery 416 such that second electrical contact 460 disposed on the grippers 452 are brought into electrical contact with the first electrical contact 236 on the outer surface 232. This contact completes a circuit from the power source 280 through the electrical conveyance 237, the connection at the first electrical contact 236 and second electrical contact 460, and through the electrical conveyance 476 to the battery 472. When the battery 472 is fully charged the current flow can be stopped. When the battery 472 is fully charged the user can be signaled through a user interface 376 on the free standing accessory stand 104 or a user interface 480 on the portable accessory 108.

In another mode the connection between the first electrical contact 236 and the second electrical contact 460 can enable the portable accessory 108 to operate directly on the power of the power source 280 in the free standing accessory stand 104. Such operation can be without drawing current from the battery 472. In another mode the connection between the first electrical contact 236 and the second electrical contact 460 can enable the portable accessory 108 to operate directly on AC current via the AC port 237A of the free standing accessory stand 104. Such operation can be without drawing current from the battery 472.

Example of Operation

The assembly 100 and the components thereof can operate in a number of different ways. The portable accessory 108 can operate using a Bluetooth communication. The user interface 376, the control buttons 380, and/or the user interface 480 can be used to cause a Bluetooth transceiver to start search for and mate with another transceiver, e.g., in a cellphone. A tone or sound can be emitted to confirm that the Bluetooth functionality is engaged. The connection between a cellphone (and/or other devices) can be initiated at that device as well. An application can be provided on the cellphone to show the assembly 100 and indicated how and when the connection is made. The phone or other device can control function such as speaker volume or light intensity. The user interface 480 can also control the level of the light from the portable accessory 108. One or more of the user interface 376, control buttons 380, and user interface 480 can be used to turn on or raise or lower the level of the lights 246, the lights 262, or the lights 436. The free standing accessory stand 104 and the portable accessory 108 can also be configured to automatically wirelessly communicate upon connecting the portable accessory 108 to the accessory support 220. This can be due to the proximity of these components by automatic pairing or by engaging the first electrical contact 236 with the second electrical contact 460. In some configuration the free standing accessory stand 104 is controlled by the portable accessory 108. For example after the portable accessory 108 is engaged (either wirelessly or through the contacts) the free standing accessory stand 104 can be configured to respond to control signals primarily or in some cases only from the portable accessory 108.

The portable accessory 108 can be removed from the free standing accessory stand 104, e.g., from the accessory support 220 and mounted to an umbrella or other device as discussed above. At that point, the free standing accessory stand 104 can be left in the first configuration 252 with the cap 240 extended from the upper surface 216 or the free standing accessory stand 104 can be actuated to the second configuration 256 with the cap 240 moved close to the upper surface 216 to a lower profile position. In this position the free standing accessory stand 104 can be placed on a compact shelf while still being able to provide speaker and/or light function.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

The terms "approximately," "about," and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, 0.1 degree, or otherwise.

Some embodiments have been described in connection with the accompanying drawings. However, it should be understood that the figures are not drawn to scale. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

For purposes of this disclosure, certain aspects, advantages, and novel features are described herein. It is to be understood that not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Although these inventions have been disclosed in the context of certain preferred embodiments and examples, it will be understood by those skilled in the art that the present inventions extend beyond the specifically disclosed embodiments to other alternative embodiments and/or uses of the inventions and obvious modifications and equivalents thereof. In addition, while several variations of the inventions have been shown and described in detail, other modifications, which are within the scope of these inventions, will be readily apparent to those of skill in the art based upon this disclosure. It is also contemplated that various combination or sub-combinations of the specific features and aspects of the embodiments may be made and still fall within the scope of the inventions. It should be understood that various features and aspects of the disclosed embodiments can be combined with or substituted for one another in order to form varying modes of the disclosed inventions. Further, the actions of the disclosed processes and methods may be modified in any manner, including by reordering actions and/or inserting additional actions and/or deleting actions. Thus, it is intended that the scope of at least some of the present inventions herein disclosed should not be limited by the particular disclosed embodiments described above. The limitations in the claims are to be interpreted broadly based on the language employed in the claims and not limited to the examples described in the present specification or during the prosecution of the application, which examples are to be construed as non-exclusive.

What is claimed is:

1. A free standing accessory stand, comprising:
    a ground support comprising a plurality of spaced apart feet;
    an enclosure extending upward relative to the ground support, the enclosure disposed about a central axis of the enclosure, the enclosure surrounding a component space configured for one or more electrical components to be disposed therein;
    an upper surface disposed in a plane transverse to the central axis of the enclosure, the upper surface facing away from the ground support;
    an accessory support having an outer surface projecting away from the upper surface along the central axis of the enclosure;
    a cap disposed at a free end of the accessory support, the cap having a lower surface disposed in a plane transverse to the central axis of the enclosure; and
    a mounting space is provided between the upper surface of the enclosure, the lower surface of the cap, and the outer surface of the accessory support;
    wherein a speaker is disposed in the component space within the enclosure and the ground support comprises a wall comprising a plurality of apertures aligned with the speaker.

2. The free standing accessory stand of claim 1, wherein the component space is disposed along the central axis of the enclosure.

3. The free standing accessory stand of claim 1, wherein the accessory support is moveable relative to the enclosure such that the accessory support can be extended from the enclosure in a first configuration of the free standing accessory stand and retracted into the enclosure in a second configuration of the free standing accessory stand.

4. The free standing accessory stand of claim 3, wherein when the free standing accessory stand is in the second configuration the lower surface of the cap is disposed adjacent to upper surface of the of the free standing accessory stand.

5. A free standing accessory stand, comprising:
    a ground support comprising a plurality of spaced apart feet;
    an enclosure extending upward relative to the ground support, the enclosure disposed about a central axis of the enclosure, the enclosure surrounding a component space configured for one or more electrical components to be disposed therein;
    an upper surface extending transversely away from the central axis of the enclosure, the upper surface facing away from the ground support;
    an accessory support having an outer surface projecting away from the upper surface along the central axis of the enclosure;
    a cap disposed at a free end of the accessory support, the cap having a lower surface extending transversely away from the central axis of the enclosure; and a mounting space is provided between the upper surface of the enclosure, the lower surface of the cap, and the outer surface of the accessory support;

wherein a speaker is disposed in the component space within the enclosure;

wherein the ground support comprises a lower wall comprising a plurality of apertures disposed adjacent to the speaker, the apertures being at a higher elevation than the spaced apart feet when the accessory stand is upright, the apertures opening up to a exposed areas beneath a lower wall of the ground support.

6. The free standing accessory stand of claim 1, wherein the component space is disposed about the central axis of the enclosure.

7. A free standing accessory stand, comprising:
a ground support comprising a plurality of spaced apart feet;
an enclosure extending upward relative to the ground support, the enclosure disposed about a central axis of the enclosure, the enclosure surrounding a component space configured for one or more electrical components to be disposed therein;
an upper surface extending transversely away from the central axis of the enclosure, the upper surface facing away from the ground support;
an accessory support having an outer surface projecting away from the upper surface along the central axis of the enclosure;
a cap disposed at a free end of the accessory support, the cap having a lower surface extending transversely away from the central axis of the enclosure; and
a mounting space is provided between the upper surface of the enclosure, the lower surface of the cap, and the outer surface of the accessory support;
wherein the component space is disposed about the central axis of the enclosure;
wherein the free standing accessory stand comprises a battery disposed in the component space.

8. An assembly, comprising:
a free standing accessory stand, comprising:
a ground support comprising a plurality of spaced apart feet;
an enclosure extending upward relative to the ground support, the enclosure disposed about a central axis of the enclosure, the enclosure surrounding a component space configured for one or more electrical components to be disposed therein;
an upper surface disposed in a plane transverse to the central axis of the enclosure, the upper surface facing away from the ground support;
an accessory support having an outer surface projecting away from the upper surface along the central axis of the enclosure;
a cap disposed at a free end of the accessory support, the cap having a lower surface disposed in a plane transverse to the central axis of the enclosure; and
a mounting space is provided between the upper surface of the enclosure, the lower surface of the cap, and the outer surface of the accessory support; and
a portable light comprising:
a light enclosure comprising a first shell and a second shell;
an outer periphery and an inner periphery each defined in part by the first shell and the second shell;
a light disposed within the light enclosure; and
wherein the first and second shells are configured to be separated from each other to permit the accessory support of the free standing accessory stand to be advanced into the outer periphery of the enclosure and to be disposed within the inner periphery of the enclosure and secure together when the accessory support is disposed within the inner periphery such that the portable light is disposed within the mounting space of the free standing accessory stand.

9. The an assembly of claim 8, wherein the accessory support comprises a first electrical contact and the portable light comprises a second electrical contact disposed on or within the inner periphery of the light enclosure and, the assembly configured such that when the inner periphery of the light enclosure is disposed about the accessory support and the first shell is secured to the second shell, the first electrical contact engages the second electrical contact.

10. The an assembly of claim 9, wherein the portable light comprises a plurality of grippers configured to engage the accessory support when the accessory support is disposed within the inner periphery of the enclosure and when the first shell is secured to the second shell, the first contact disposed on the gripper.

11. The assembly of claim 10, wherein the assembly is configured such that when the first contact engages the second contact a battery disposed in the portable light can be charged by a power source disposed in the free standing accessory stand.

12. The assembly of claim 10, wherein the assembly is configured such that when the first contact engages the second contact a component disposed in the portable light can be activated by the free standing accessory stand.

13. The assembly of claim 10, wherein the assembly is configured such that when the first contact engages the second contact a component disposed in the free standing accessory stand can be activated by the portable light.

14. A portable accessory, comprising:
an accessory enclosure comprising a first shell and a second shell;
an outer periphery and an inner periphery each defined in part by the first shell and the second shell;
an electrical component disposed within the accessory enclosure;
an electrical contact disposed on or within the inner periphery of the accessory enclosure;
wherein the portable accessory is configured to provide or receive an electrical impulse through the electrical contact.

15. The portable accessory of claim 14, further comprising a gripper disposed within the inner periphery configured to project into a space surrounded by the inner periphery, the gripper configured to engage an accessory support when the accessory support is disposed within the inner periphery of the enclosure.

16. The portable accessory of claim 15, wherein the electrical contact is disposed on the gripper such that when the first shell is secured to the second shell, the electrical contact is engaged with the accessory support.

17. The portable accessory of claim 14, wherein the electrical component comprises one or more lights.

18. A free standing accessory stand, comprising:
a ground support comprising a plurality of spaced apart feet;
an enclosure extending upward relative to the ground support, the enclosure disposed about a central axis of the accessory stand;
an upper surface disposed in a plane transverse to the central axis, the upper surface facing away from the ground support; and a retractable accessory support having an outer surface and movable between a first configuration and a second configuration;

wherein in the first configuration, a mounting space is provided along the outer surface of the retractable accessory support above the upper surface of the enclosure;

wherein in the second configuration, the retractable accessory support is retracted within the enclosure and a lower surface of a cap disposed at a free end of the retractable accessory support cap is adjacent the upper surface of the enclosure.

19. An assembly, comprising:
the free standing accessory stand of claim 18; and
a portable light comprising:
 a light enclosure comprising a first shell and a second shell;
 an outer periphery and an inner periphery each defined in part by the first shell and the second shell;
 a light disposed within the light enclosure; and
 wherein the first and second shells are configured to be separated from each other to permit the retractable accessory support of the free standing accessory stand to be advanced into the outer periphery of the enclosure and to be disposed within the inner periphery of the enclosure and secure together when the accessory support is disposed within the inner periphery such that the portable light is disposed within the mounting space of the free standing accessory stand in the first configuration.

20. The an assembly of claim 19, wherein the retractable accessory support comprises a first electrical contact and the portable light comprises a second electrical contact, the assembly configured such that when the light enclosure is disposed about the retractable accessory support, the first electrical contract engages the second electrical contact.

21. The an assembly of claim 20, wherein the second electrical contact is disposed on or within the inner periphery of the light enclosure and, the assembly is configured such that when the inner periphery of the light enclosure is disposed about the retractable accessory support and the first shell is secured to the second shell, the first electrical contract engages the second electrical contact.

22. The free standing accessory stand of claim 18, wherein a speaker is disposed in the enclosure.

23. The free standing accessory stand of claim 22, wherein the ground support comprises a lower wall comprising a plurality of apertures disposed adjacent to the speaker, the apertures being at a higher elevation than the spaced apart feet when the accessory stand is upright, the apertures opening up to a exposed areas beneath a lower wall of the ground support.

24. The free standing accessory stand of claim 18, wherein the free standing accessory stand comprises a battery disposed in the enclosure.

25. The free standing accessory stand of claim 18, wherein the ground support comprises a wall comprising a plurality of apertures opening to an open area adjacent to the apertures.

* * * * *